(12) United States Patent
Sumi et al.

(10) Patent No.: US 7,671,326 B2
(45) Date of Patent: Mar. 2, 2010

(54) IMAGE INPUTTING APPARATUS

(75) Inventors: Shinobu Sumi, Mitaka (JP); Takafumi Ohashi, Fussa (JP); Yasushi Mizutani, Musashimurayama (JP); Kazuhiro Sasaki, Sagamihara (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/148,790

(22) Filed: Apr. 22, 2008

(65) Prior Publication Data

US 2008/0265186 A1    Oct. 30, 2008

(30) Foreign Application Priority Data

| Apr. 27, 2007 | (JP) | ............................. 2007-118571 |
| Jun. 29, 2007 | (JP) | ............................. 2007-172770 |
| Sep. 4, 2007 | (JP) | ............................. 2007-228917 |
| Sep. 21, 2007 | (JP) | ............................. 2007-245027 |

(51) Int. Cl.
*H01J 5/02* (2006.01)
(52) U.S. Cl. .................................... 250/239; 250/208.1
(58) Field of Classification Search ................ 250/239, 250/216, 208.1; 257/80–85, 433–440; 438/430, 438/29, 25
See application file for complete search history.

(56) References Cited

U.S. PATENT DOCUMENTS

| 5,902,993 | A | * | 5/1999 | Okushiba et al. | ......... 250/208.1 |
| 7,141,491 | B2 | * | 11/2006 | Yamazaki et al. | ........... 438/487 |
| 7,146,106 | B2 | * | 12/2006 | Yang et al. | .................. 398/138 |
| 7,199,359 | B2 | * | 4/2007 | Webster | ...................... 250/239 |
| 7,227,236 | B1 | * | 6/2007 | Lee et al. | ..................... 257/433 |
| 7,332,712 | B2 | * | 2/2008 | Webster | ...................... 250/239 |

FOREIGN PATENT DOCUMENTS

JP     2000-057328 A    2/2000

* cited by examiner

*Primary Examiner*—Seung C Sohn
(74) *Attorney, Agent, or Firm*—Frishauf, Holtz, Goodman & Chick, P.C.

(57) ABSTRACT

Disclosed is an image inputting apparatus including: a base; a sensor main body coupled with the base so as to be able to move in a vertical direction on the base; a switch provided on either one of an upper surface side of the base or a lower surface side of the sensor main body; and a convex part provided on another one of the upper surface side of the base or the lower surface side of the sensor main body at a position facing to the switch.

27 Claims, 25 Drawing Sheets

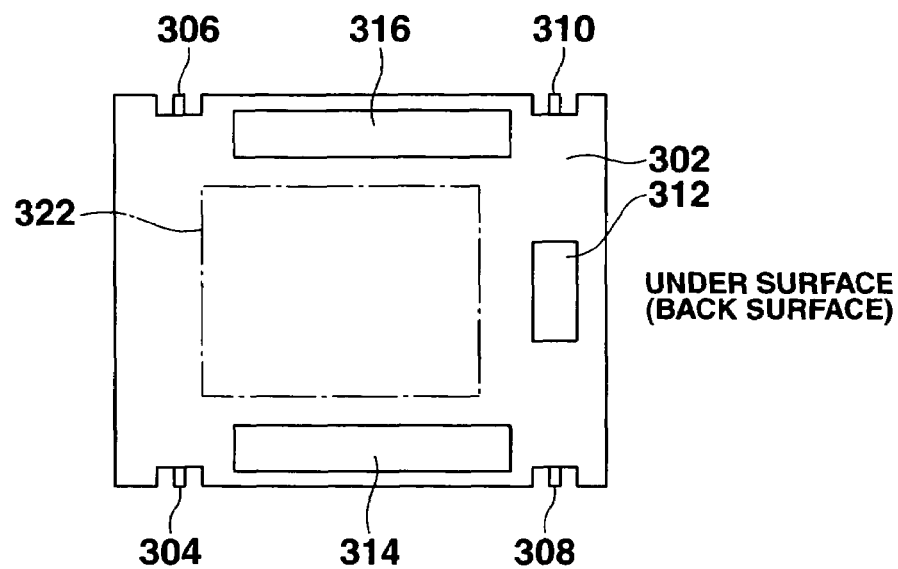
FIG.4A
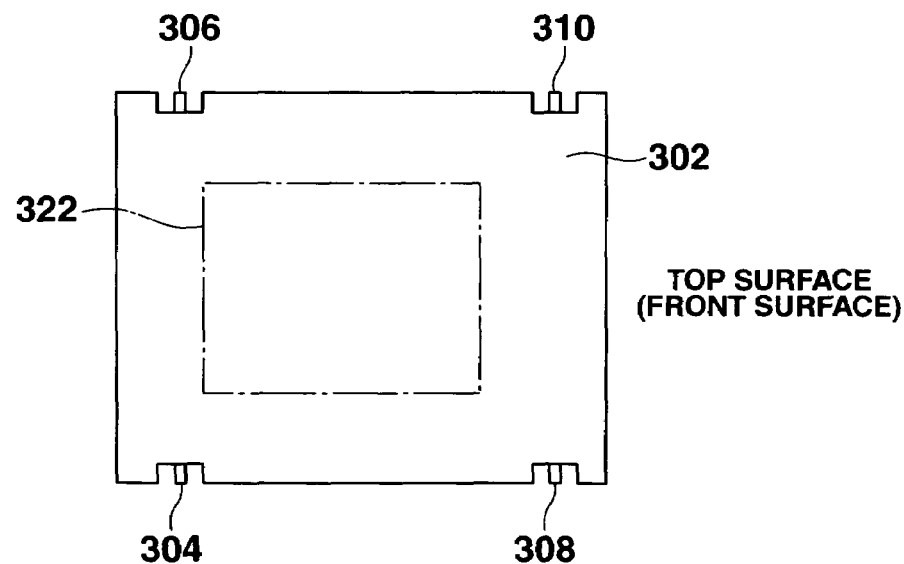
FIG.4B
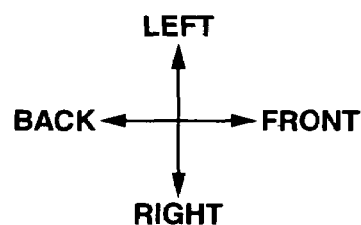

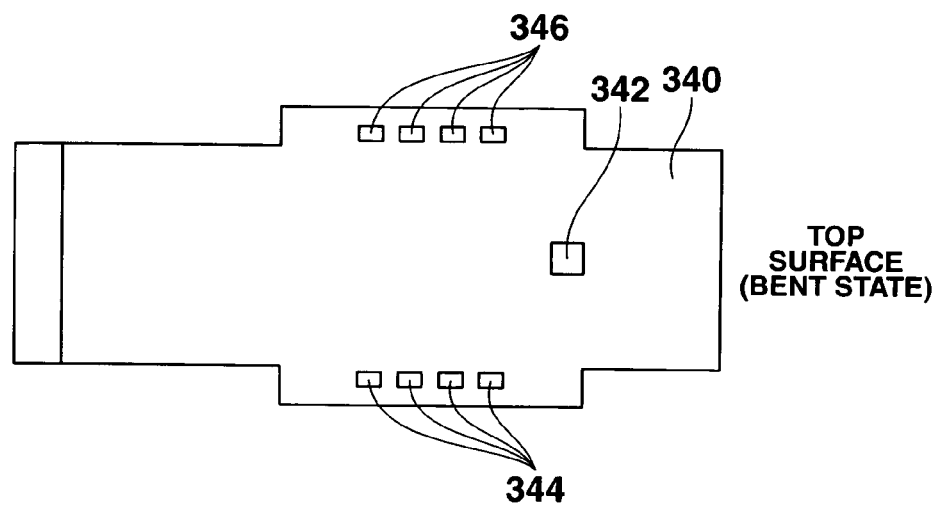
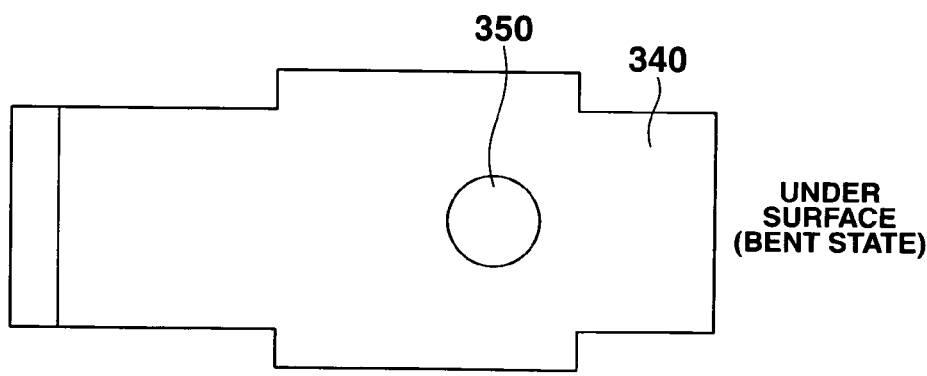
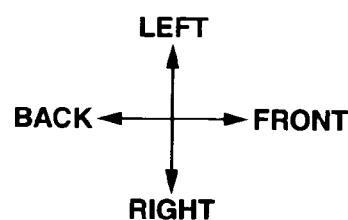

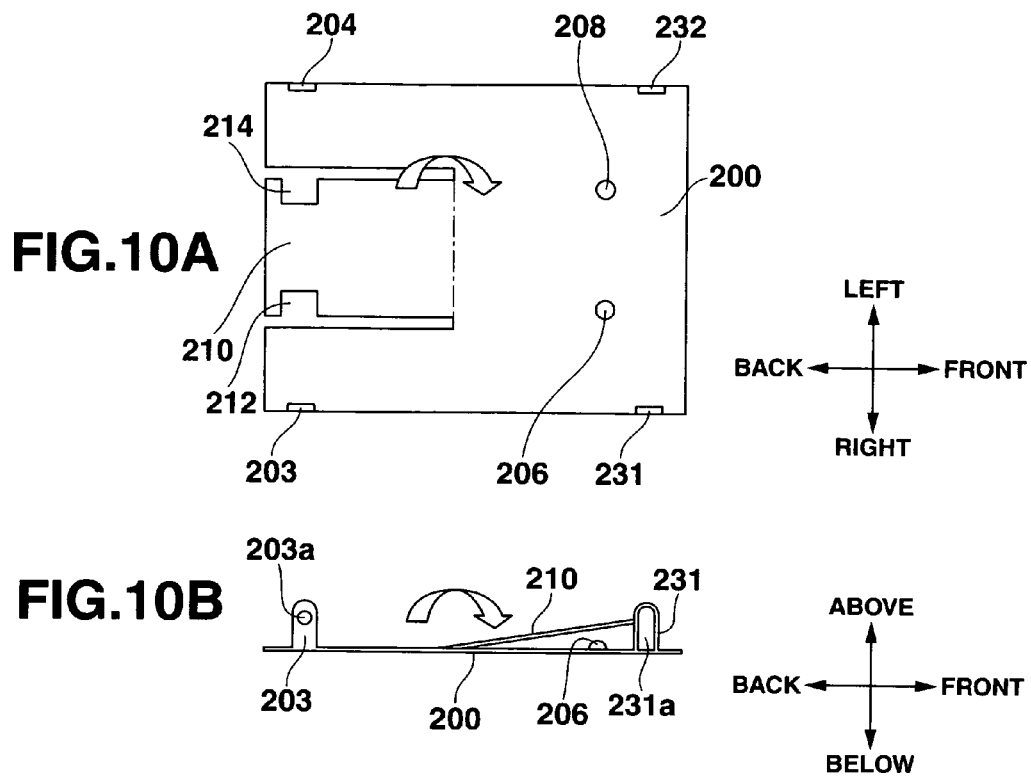
FIG.10A
FIG.10B
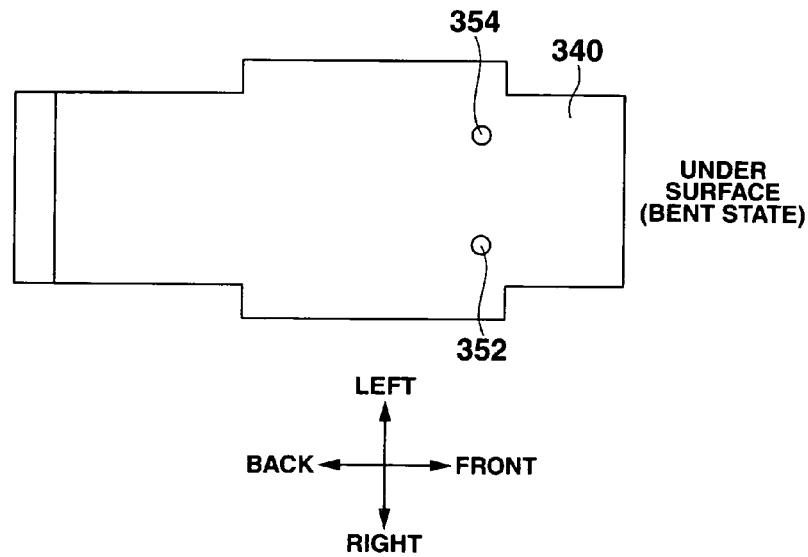
FIG.11

IMAGE INPUTTING APPARATUS

BACKGROUND OF THE INVENTION

1. Field of the Invention

The present invention relates to an image inputting apparatus, and more particularly to a switch mechanism to indicate a start of image inputting.

2. Description of Related Art

In recent years, the requirements of reliability and safety to the management and the protection of personal information or business information, or to the security thereof such as the prevention of crimes, have socially risen, and person authentication has been recognized as a very important subject. In order to meet the rise of such a social requirement, the technology developments of the person authentication using biological information, such as a fingerprint, an iris, or a vein, have been actively performed.

In order to take the biological information into a person authentication system, various sensors have been developed. As the sensors, there are optical, electrical capacitance, electric field, thermal, pressure sensitive, ultrasonic, and the other sensors. The surface or internal morphology of a testing object (for example, a finger) that touches the contact surface of a sensor is taken in as an image by the sensor, and the take image is used as biological information to be collated by the person authentication system.

In order to suppress the power consumption of the sensor, the sensing operation of the sensor is performed only when the testing object touches the sensor. To put it concretely, a push switch is provided on the lower side of the sensor, and an output signal of the push switch operates as a trigger to start the operation of the sensor when the sensor is pushed down by the testing object and the push switch is pushed (see, a first patent document: Japanese Patent Application Laid-Open Publication No. 2000-57328).

Now, the technique disclosed in the first patent document disposes a leaf spring 15 urging a sensor device 2 upward in a space between the sensor device 2 and a contact connection switch 18, and allows the leaf spring to touch the contact connection switch against the urging force thereof to conduct only when the sensor device is pushed in by the testing object. Thus, a sensing operation is performed. However, in the technique, the leaf spring is bent upward at the time of non-sensing operation (see FIG. 1 of the first patent document). Even if the leaf spring receives depressing force by the testing object at the time of a sensing operation, the leaf spring is not always surely flattened to touch the contact connection switch to conduct (see FIG. 3 of the first patent document).

Furthermore, if the sensor is further pushed in while the push switch is pushed by the sensor, then the sensor is bent in the state of being supported by the push switch. Consequently, there is the possibility of the damage of the sensor. Accordingly, the present applicant has zealously performed research and development, and suppressed the damage of the sensor by attaining the improvement of the strength of the sensor. But it is still desired to reduce the probability of occurrence of the damage of the sensor furthermore.

SUMMARY OF THE INVENTION

Accordingly, it is the primary object of the present invention to provide an image inputting apparatus that can surely start a sensing operation by realizing conduction when the depressing of a testing object is applied.

It is the other primary object of the present invention to provide an image inputting apparatus capable of suppressing the damage of the sensor main body.

According to one aspect of the present invention, a convex part is disposed so as to face a switch. Consequently, when the sensor main body is pushed down by a testing object, the depressing force of the testing object is concentrated to the convex part or to the neighborhood thereof, and the switch easily conducts. Hence, a sensing operation can be surely started at the time of receiving the depressing of the testing object.

According to the other aspect of the present invention, when the sensor main body is pushed down, the switch is pushed or touched, and the switch is turned on from the off state thereof and vice versa. When the sensor main body is further pushed down, the lower surface side of the sensor main body or the upper surface side of a base is received by a receiving section. Consequently, the sensor main body is not bent downward furthermore, and then the damage of the sensor main body can be suppressed.

According to the other aspect of the present invention, when the sensor main body is pushed down, the lower surface of the sensor main body and the upper surface of the base form an acute angle on the rotation shaft side of the sensor main body. Consequently, the lower surface of the sensor main body is further received by the upper surface of the base on the rotation shaft side, and thereby the sensor main body is not further bent downward. Hence, the damage of the sensor main body can be suppressed.

To achieve the above object, according to a first aspect of the invention, an image inputting apparatus includes: a base; a sensor main body coupled with the base so as to be able to move in a vertical direction on the base; a switch provided on either one of an upper surface side of the base or a lower surface side of the sensor main body; and a convex part provided on another one of the upper surface side of the base or the lower surface side of the sensor main body at a position facing to the switch.

Preferably, the base includes a turned-up section to include a turned-up part to urge the sensor main body upward in a state of abutting against the lower surface side of the sensor main body.

Preferably, the base includes a bent section to include a bent part to urge the sensor main body upward in a state of abutting against the lower surface side of the sensor main body.

Preferably, the image inputting apparatus further includes a wired sheet to include patterned wiring connected to the sensor main body, wherein: an electronic part is mounted on the wired sheet; and a concave part to be able to house the electronic part is formed in the sensor main body.

Preferably, the sensor main body includes a back light section to emit a light; the electronic part includes a light emitting device; and the concave part to be able to house the light emitting device is formed in the back light section.

Preferably, the image inputting apparatus further includes a wired sheet provided either one of the upper surface side of the base or the lower surface side of the sensor main body, the wired sheet including patterned wiring connected to sensor main body and the switch.

Preferably, the convex part is provided at a position corresponding to an outside of a sensing area of the sensor main body, the sensing area capable of performing sensing.

To achieve the above object, according to a second aspect of the invention, an image inputting apparatus includes: a base; a sensor main body coupled with the base so as to be able to move in a vertical direction on the base; a switch provided either one of an upper surface side of the base or a lower surface side of the sensor main body; and a receiving section provided on either one of the upper surface side of the base or the lower surface side of the sensor main body to project toward an facing surface.

Preferably, the image inputting apparatus further comprising a supporting section to couple the base with the sensor main body, wherein the sensor main body can rotate in a vertical direction by using the supporting section as a shaft.

Preferably, the receiving section is provided between a rotation shaft center of the sensor main body and a contact surface to which the switch touches when the sensor main body rotates or the switch.

Preferably, the image inputting apparatus further includes a convex part formed on another one of the upper surface side of the base or the lower surface side of the sensor main body at a position corresponding to the switch.

Preferably, the image inputting apparatus further includes a wired sheet to include patterned wiring connected to the sensor, wherein the wired sheet is provided either one of the upper surface side of the base or the lower surface side of the sensor main body, and the convex part is provided at a position to overlap with a part of the wired sheet where the wiring is not formed.

Preferably, the image inputting apparatus further includes a wired sheet to include patterned wiring connected to the sensor, wherein the wired sheet is provided on either one of the upper surface side of the base or the lower surface side of the sensor main body; and the receiving section is provided at a position to overlap with a part of the wired sheet where the wiring is not formed.

Preferably, the image inputting apparatus further includes a supporting section to couple the base with the sensor main body, wherein the receiving section is disposed between the supporting section and the convex part.

Preferably, the image inputting apparatus further includes a plurality of the receiving sections; and a convex part formed on another one of the upper surface side of the base or the lower surface side of the sensor main body at a position corresponding to the switch, wherein the convex part is provided between the plurality of receiving sections in a direction of a rotation shaft center of the sensor main body.

Preferably, the convex part is provided at a position corresponding to an outside of a sensing area of the sensor main body in which area sensing can be performed.

Preferably, the receiving section is provided at a position corresponding to an outside of a sensing area of the sensor main body in which area sensing can be performed.

To achieve the above object, according to a third aspect of the invention, an image inputting apparatus includes: a base; a sensor main body including a first end face and a second end face to be provided rotatably on the base in a vertical direction; and a rotation shaft to enable the base and the sensor main body to rotate in the vertical direction, wherein: the rotation shaft is situated nearer to the second end face rather than to the first end face; a part where a surface direction of the lower surface of the sensor main body and a surface direction of the upper surface of the base intersect with each other is situated nearer to the second end face rather than to the first end face; and an intersection angle formed by the surface direction of the lower surface of the sensor main body and the surface direction of the upper surface of the base forms an acute angle.

To achieve the above object, according to a fourth aspect of the invention, an image inputting apparatus includes: a base; and a sensor main body provided on the base so as to be able to rotate in a vertical direction, wherein an upper surface of the base is inclined to a lower surface of the base, or a lower surface of the sensor main body is inclined to an upper surface of the sensor main body.

To achieve the above object, according to a fifth aspect of the invention, an image inputting apparatus includes: a base; a sensor main body to include a first end face and a second end face to be provided on the base so as to be able to rotate in a vertical direction; a rotation shaft to enable the base and the sensor main body to rotate in the vertical direction; and a switch to be provided on either one of an upper surface of the base or a lower surface of the sensor main body at a position of the sensor main body, the position distant from the rotation shafts, wherein the rotation shaft is situated nearer to the second end face rather than to the first end face; a part where a surface direction of the lower surface of the sensor main body and a surface direction of the upper surface of the base intersect with each other in a sate in which the sensor main body is rotated onto a side of the base to switch an on and an off of the switch is situated nearer to the second end face rather than to the first end face; and an intersection angel of the surface direction of the lower surface of the sensor main body and the surface direction of the upper surface of the base is formed as an acute angle.

To achieve the above object, according to a sixth aspect of the invention, an image inputting apparatus includes: a base; a sensor main body to include a first end face and a second end face to be provided to be able to rotate on the base in a vertical direction; a rotation shaft to enable the base and the sensor main body to rotate in the vertical direction; and a push switch provided on either one of an upper surface of the base or a lower surface of the sensor main body at a position distant from the rotation shafts of the sensor main body, wherein the rotation shafts is situated nearer to the second end face rather than to the first end face; a part where a surface direction of the lower surface of the sensor main body and a surface direction of the upper surface of the base intersect with each other in a sate in which the sensor main body is rotated onto a side of the base to push the push switch is situated nearer to the second end face rather than to the first end face; and an intersection angel of the surface direction of the lower surface of the sensor main body and the surface direction of the upper surface of the base is formed as an acute angle.

Preferably, the switch is a push switch having a shape capable of being restored.

Preferably, the image inputting apparatus further includes a convex part formed on either one of the upper surface of the base or the lower surface of the sensor main body at a position to face to the switch.

Preferably, the upper surface of the sensor main body and the lower surface of the base is in parallel to each other in a state in which the switch is restored.

Preferably, a thickness of the base in the vertical direction gradually increases from the switch to the rotation shafts of the sensor main body.

Preferably, a thickness of the sensor main body in the vertical direction gradually increases from the switch to the rotation shafts of the sensor main body.

BRIEF DESCRIPTION OF THE DRAWINGS

The present invention will become more fully understood from the following detailed description and the appended drawings, and thus are not intended as a definition of the limits of the invention, and wherein:

FIG. 4A is a back surface view showing a back light section provided in the image inputting apparatus;

FIG. 4B is a front surface view showing the back light section provided in the image inputting apparatus;

FIG. 5A is a back surface view showing a wired sheet provided in the image inputting apparatus;

FIG. 5B is a front surface view showing the wired sheet provided in the image inputting apparatus;

FIG. 10A is a plan view of a base provided in the image inputting apparatus of the second embodiment;

FIG. 10B is a side view of the base provided in the image inputting apparatus of the second embodiment;

FIG. 11 is a front surface view of a wired sheet provided in the image inputting apparatus of the second embodiment;

DETAILED DESCRIPTION OF THE PREFERRED EMBODIMENTS

In the following, the preferable embodiments of the present invention will be described with reference to the attached drawings. Incidentally, although technically preferable various limitations for implementing the present invention are given to the embodiments to be described below, these limitations do not limit the scope of the invention to the following embodiments shown examples.

First Embodiment

Figure 1:
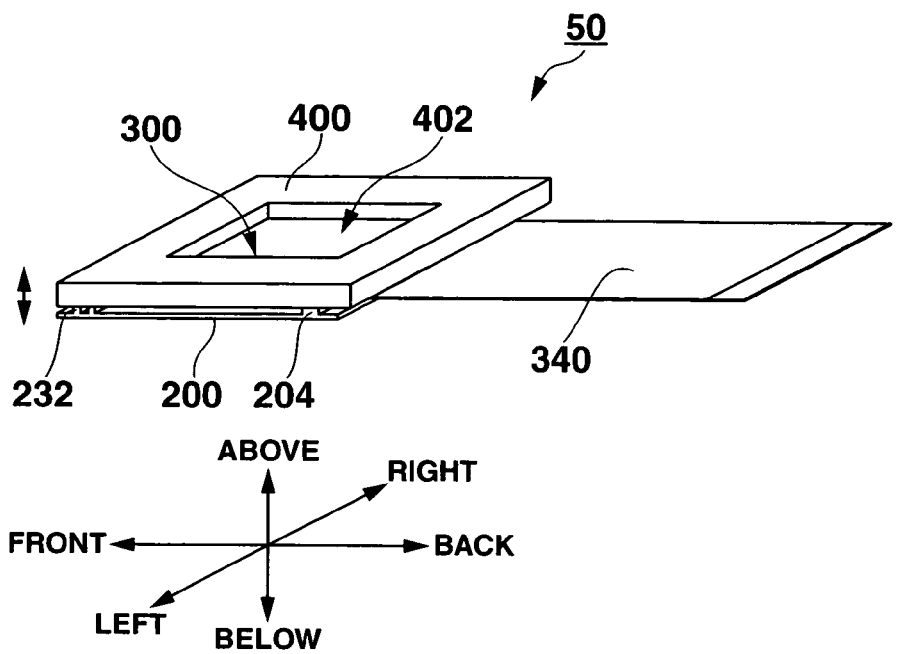
FIG. 1 is a perspective view showing an image inputting apparatus of a first embodiment of the present invention.
Figure 2:
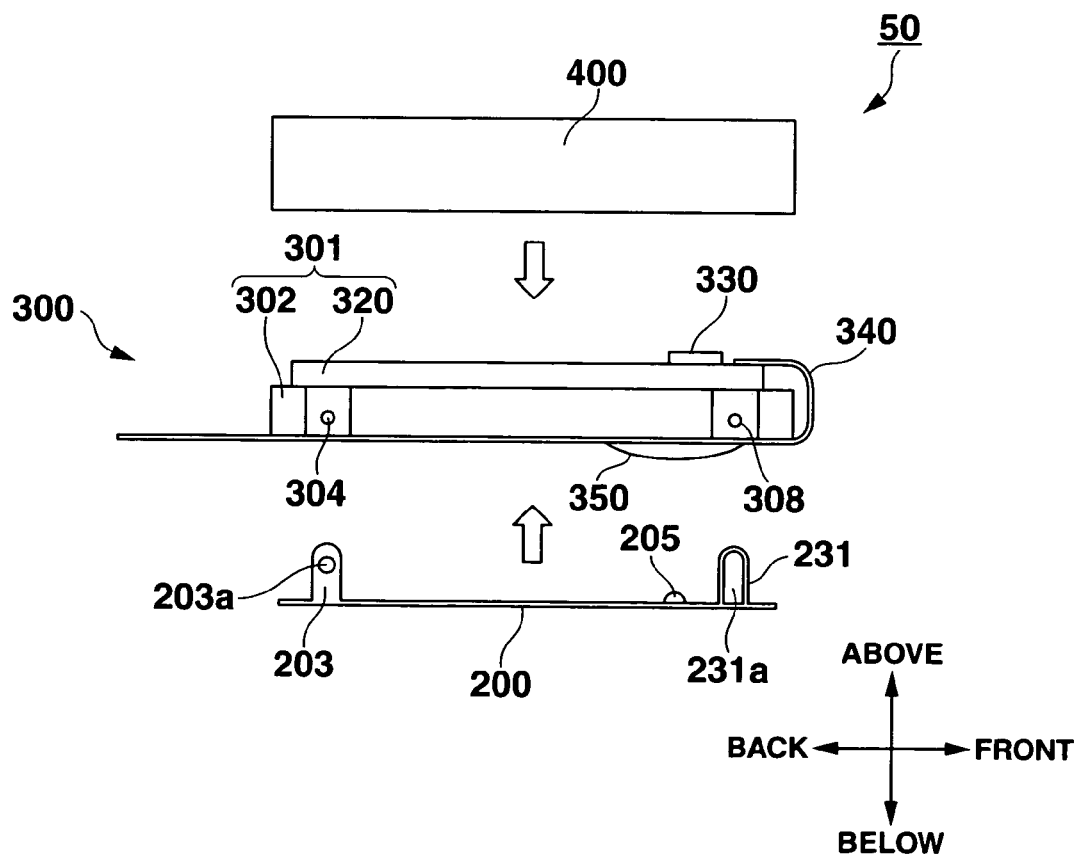
FIG. 2 is an exploded side view showing the image inputting apparatus.

FIG. 1 is a perspective view showing an image inputting apparatus 50 of a first embodiment of the present invention. FIG. 2 is an exploded side view of the image inputting apparatus 50.

As shown in FIG. 1, the image inputting apparatus 50 has a plate-like or thin plate-like base 200. A sensor section 300 is provided on the base 200, and the sensor section 300 is covered by a cover 400. The cover 400 is shaped in a rectangular frame, and a sensing area 322 of the sensor section 300 is exposed from the aperture section 402 of the cover 400.

Figure 3:
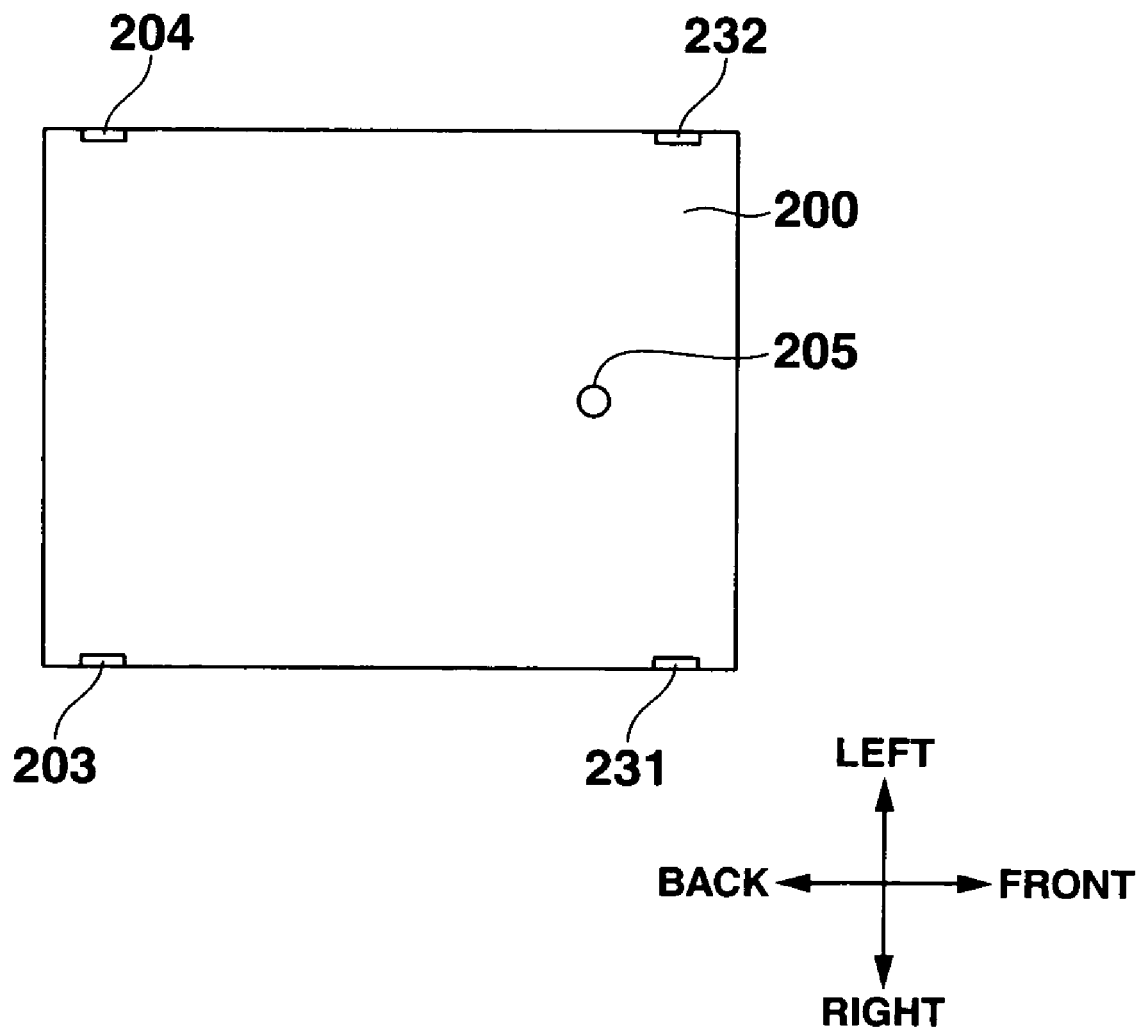
FIG. 3 is a plan view showing a base provided in the image inputting apparatus.

As shown in FIG. 2, the image inputting apparatus 50 is exploded into the three bodies of the base 200, the sensor section 300, and the cover 400 principally. As shown in FIGS. 2 and 3, supporting sections 203 and 204 are each provided on both the sides of the base 200 near the rear thereof, and guiding sections 231 and 232 are each provided on both the sides of the base 200 near the front thereof. The supporting sections 203 and 204 and the guiding sections 231 and 232 are provided in a standing state on the upper surface side of the base 200.

A shaft hole 203a pierces the supporting section 203 in a right-left direction, and a shaft hole 204a pierces the supporting section 204 in the right-left direction. The shaft holes 203a and 204a are concentric in the right-left direction. Long holes 231a and 232a long in the vertical direction are formed in the guiding sections 231 and 232, respectively.

A convex part 205 is formed on the upper surface side of the base 200. The convex part 205 is a convex part formed on the upper surface side of the base 200 in a projecting state from the upper surface side.

The sensor section 300 includes a sensor main body 301 composed of a back light section 302 and a sensor chip 320 principally. In the sensor main body 301, the back light section 302 is disposed on the lower side and the sensor chip 320 is mounted on the back light section 302.

The back light section 302 is principally made of a light guide plate, such as an acrylic resin, (including a diffuser sheet and a reflector sheet), and diffuses and reflects light to emit the light upward. As shown in FIGS. 2, 4A, and 4B, shafts 304 and 306 are formed on both the sides of the back light section 302 near the rear thereof. The shaft 304 is inserted into the shaft hole 203a of the base 200, and the shaft 306 is inserted into the shaft hole 204a of the base 200. The supporting of the shafts 304 and 306 by the supporting sections 203 and 204 of the base 200, respectively, in such a way enables the rotation of the sensor section 300 to the base 200 in the vertical direction. Moreover, guided sections 308 and 310 are formed to protrude on both the sides of the back light section 302 near the front thereof. The guided section 308 is inserted into the long hole 231a, and the guided section 310 is inserted into the long hole 232a. The guided sections 308 and 310 are thereby guided by the guiding sections 231 and 232, respectively, in the vertical direction.

As shown in FIG. 4A, a concave part 312 is formed on the lower surface side of the back light section 302 on the front side thereof. Concave parts 314 and 316 are also formed on both the sides of the back light section 302 on the lower surface side thereof in right-left symmetry. The sensing area 322 (described below) of the sensor chip 320 is dispose almost at the central part of the back light section 302 enclosed by these concave parts 312, 314, and 316.

The sensor chip 320 is a contact type sensor using the upper surface side thereof as a sensor surface, and is a solid state image pickup device to pick up the form of the surface of a testing object (such as a finger) touching the upper surface side as an image and to input the image. In particular, the sensor chip 320 includes double-gate transistors, which are photoelectric conversion elements, as pixels, and the plurality of double-gate transistors is arranged in a matrix on a transparent glass substrate. If the sensor chip 320 is looked at from the upper surface side, then the parts between the double-gate transistors are transparent, and light transmit the parts between the double-gate transistors. Consequently, the sensor chip 320 is a transparent solid state image pickup device having optical transparency. A light entering the lower surface side of the sensor chip 320 from the lower side of the sensor chip 320 does not enter the semiconductors of the double-gate transistors. A light entering into the upper surface side of the sensor chip 320 from the upper side of the sensor chip 320 enters the semiconductors of the double-gate transistors.

Incidentally, the sensing area 322 is formed in the part to expose from the aperture section 402 of the cover 400 in the upper surface side of the sensor chip 320, and the sensing area 322 is the part in which the semiconductors of the double-gate transistors are exposed to light.

As shown in FIG. 2, a driver 330 to drive the sensor chip 320 is mounted on the upper surface side of the sensor chip 320 at the front end part thereof.

A flexible wired sheet 340 is connected to a front end part on the upper surface side of the sensor chip 320. The wired sheet 340 is bent from the front end part on the upper surface side of the sensor chip 320 to the lower surface side of the back light section 302 to be wired to the rear of the back light section 302. The wired sheet 340 is then stuck onto the lower surface side of the back light section 302.

The wired sheet 340 is made of laminated insulation films and wiring patterned between the layers to drive the sensor chip 320. The wiring formed on the wired sheet 340 is connected to a terminal of the sensor chip 320 to enable the sensor chip 320 to be conducted.

As shown in FIG. 5A, a light emitting diode 342 is mounted on the upper surface side of the wired sheet 340 at front side thereof. The light emitting diode 342 is an example of a light emitting device. An electronic part group 344 and 346, such as resistors and capacitors, are mounted on the right and left sides on the upper surface side of the wired sheet 340, respectively. As shown in FIG. 5B, a dome switch 350 is provided on the lower surface side of the wired sheet 340 to be disposed at the central part in the right-left direction of the wired sheet 340 at the time of being looked at from the front-back direction. The dome switch 350 has a restoring force to return to the original state from a pushed state, and is similarly configured to the dome switch of a fourth embodiment (see FIG. 21).

Figure 6:
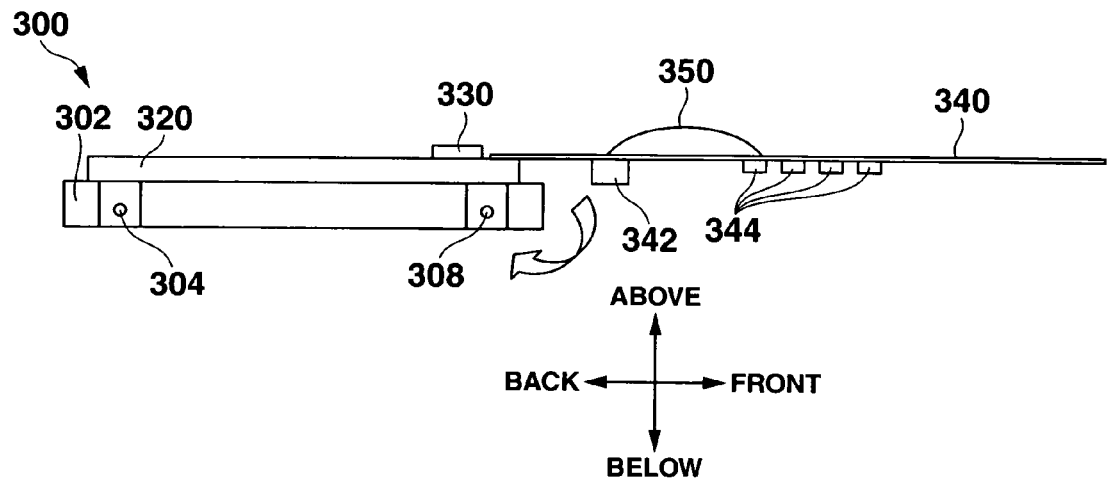
FIG. 6 is a side view showing a sensor section provided in the image inputting apparatus in the state before the wired sheet is bent.
Figure 7:
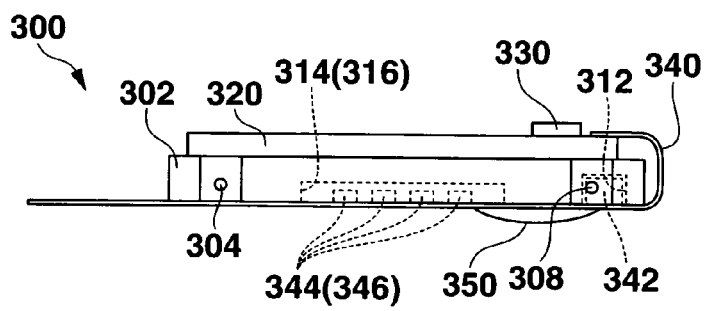
FIG. 7 is a side view of the sensor section provided in the image inputting apparatus in the state after the wired sheet has been bend.

When the wired sheet 340 is attached to the sensor section 300, as shown in FIG. 6, the wired sheet 340 is bent toward the lower side from the upper side with the front end part (see FIGS. 5A and 5B) thereof stuck to the sensor chip 320, and the wired sheet 340 is thereby stuck to the lower surface side of the back light section 302. At this time, as shown in FIG. 7, the light emitting diode 342 of the wired sheet 340 is fitted and housed in the concave part 312 of the back light section 302, and the electronic part group 344 and 346 are fitted and housed in the concave parts 314 and 316, respectively. Consequently, the wired sheet 340 is not stuck to the back light section 302 in the state of rising from the back light section 302 owing to the thicknesses of the light emitting diode 342 and the electronic part group 344 and 346, and is stuck in a plane surface state to be stuck fast to the lower surface side of the back light section 302.

Moreover, when the base 200 is attached to the sensor section 300 in the state in which the wired sheet 340 is stuck to the back light section 302, as shown in FIG. 2, the dome switch 350 of the wired sheet 340 is adapted to face to the convex part 205 of the base 200.

The installation positions of the convex part 205, the dome switch 350, and the sensor chip 320 will be now described.

The convex part 205 is formed at a position to overlap with the position where no wiring is formed on the wired sheet 340, that is, a position to overlap with the position between the pieces of wiring, when it is looked at from above.

The convex part 205 is formed at a position to be out of the sensing area 322 on the upper surface side of the sensor chip 320 when it is looked at from above. Incidentally, the sensing area 322 is an area that the sensor chip 320 can sense, and the sensor chip 320 cannot perform sensing on the outside of the sensing area.

The convex part 205 is formed at the position corresponding to the central part in the right-left direction of the sensor chip 320.

Next, the operation and the operation of the image inputting apparatus 50 will be described.

In the state in which the base 200 is attached to the sensor section 300, the convex part 205 of the base 200 faces to the dome switch 350 in an abutting state, and the sensor main body 301 is urged upward by the restoring force of the dome switch 350.

Figure 8:
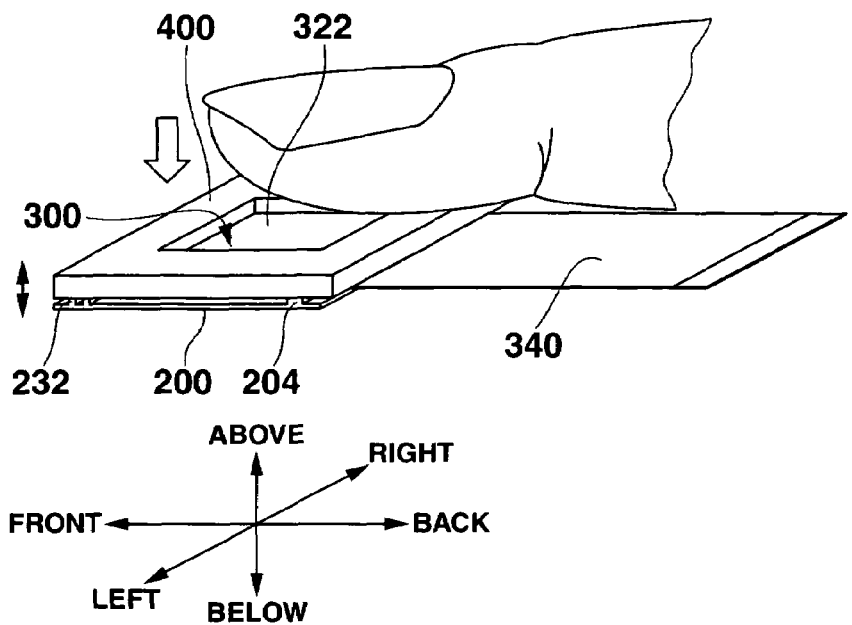
FIG. 8 is a view for illustrating the operation and the operation of the image inputting apparatus.

In this state, as shown in FIG. 8, when a subject touches the upper surface side of the sensor chip 320 with a finger or the like to push down the sensor section 300 with the finger or the like, the sensor section 300 rotates downward around the shafts 304 and 306 as fulcrums. When the sensor section 300 is pushed down, the dome switch 350 is received by the convex part 205, and is pushed by the convex part 205. When the dome switch 350 is pushed, the electric contact point section (not shown) of the dome switch 350 becomes state capable of conducting electricity, and a signal indicating the effect is output from the dome switch 350 to a controller (not shown) through the wiring of the wired sheet 340.

As a result, the controller makes the light emitting diode 342 emit a light, and outputs a sensor driving signal to the driver 330. The driver 330 drives the sensor chip 320, and the light of the light emitting diode 342 propagates in the back light section 302 to transmit the sensor chip 320. Then, the light enters the finger or the like of the subject. As a result, the finger or the like of the subject is illuminated, and the image of the finger or the like of the subject is converted into an image signal by the sensor chip 320. The image input by the sensor chip 320 is output from the driver 330 to the controller.

Then, when the subject detaches the finger from the sensor chip 320, the dome switch 350 is restored to the original state, and the sensor section 300 is rotated upward by the restoration of the dome switch 350.

According to the present embodiment described above, the convex part 205 of the base 200 is disposed to face to the dome switch 350. Consequently, when the sensor chip 320 is pushed down by the finger or the like of the subject, the depress concentrates on the convex part 205 (or the neighborhood thereof), and is surely transmitted to the dome switch 350. Consequently, it is possible to surely start a sensing operation by receiving the depressing of the finger or the like of the subject.

Furthermore, the concave parts 312, 314, and 316 are formed in the back light section 302 of the sensor main body 301, and the light emitting diode 342 and the electronic part group 344 and 346 are housed in these concave parts 312, 314, and 316, respectively. Consequently, the sensor section 300 can be formed to be thin (compactification).

Incidentally, the present invention is not limited to the embodiment described above, but the various changes of the design of the embodiment described above are included in the scope of the present invention. In the following, modifications will be cited, but the scope of the present invention is not limited to the following modifications. The following modifications are configured similarly to the image inputting apparatus 50 of the embodiment described above except for changed parts. Moreover, the following first to third modifications may be combined with one another within a possible range.

[First Modification]

The position at which the dome switch 350 is provided may be replaced with the position at which the convex part 205 is provided. If the dome switch is provided on the upper surface side of the base 200, then the wiring other than the wired sheet 340 may be provided on the upper surface side of the base 200, and the wiring may be connected to the dome switch. The convex part to be pushed in the dome switch may be formed on the lower surface side of the back light section 302, or may be formed on the wired sheet 340.

[Second Modification]

Moreover, although the convex part 205 is a projection in the embodiment described above, the convex part 205 may be a convex or a convex part of another shape.

[Third Modification]

Moreover, a touch switch (touch sensor to detect a touch) may be provided on the wired sheet 340 in place of the dome switch 350. In this case, an elastic material (such as a spring and a rubber) is put between the lower surface side of the back light section 302 and the base 200, and the touch switch does not touch the convex part 205 by the elastic material in a natural state (the state in which the sensor main body 301 is not pushed in). On the other hand, when the sensor main body 301 is pushed down, the elastic material is compressed, and the touch switch touches the convex part 205. Then, when the pushing to the sensor main body 301 is released, the elastic material is restored, and the touch switch is separated from the convex part 205.

Second Embodiment

A second embodiment differs from the first embodiment in the following points, and the other points are similar to those of the first embodiment.

Figure 9:
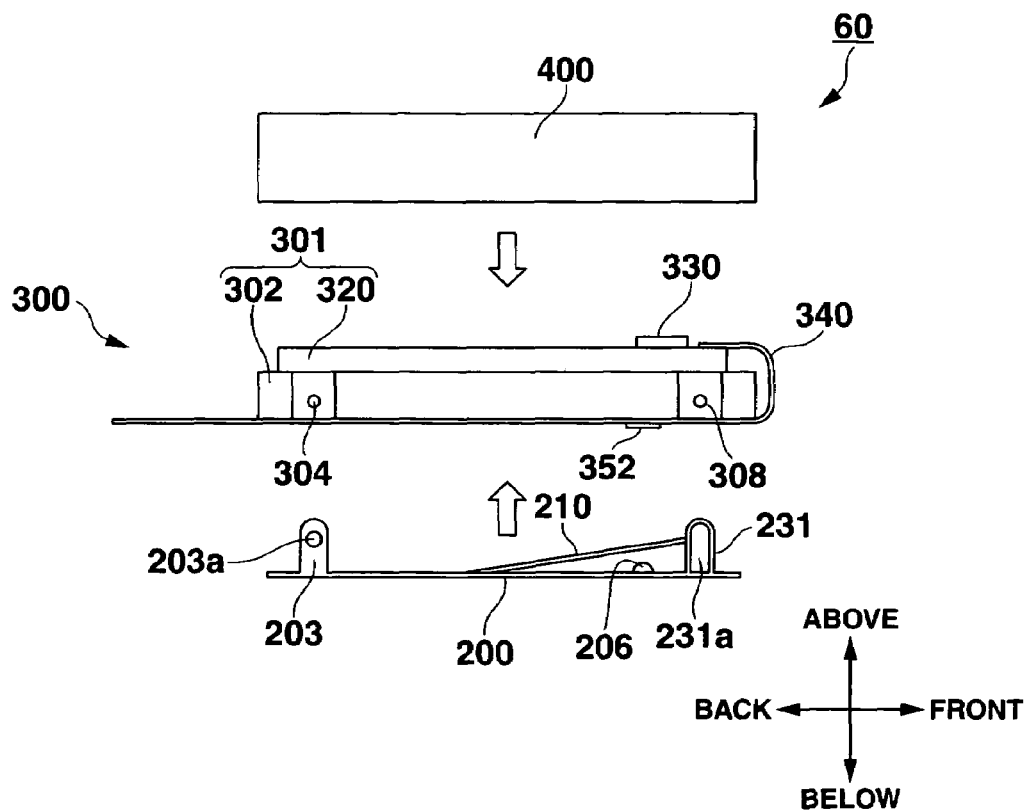
FIG. 9 is an exploded side view of an image inputting apparatus of a second embodiment of the present invention.

As shown in FIG. 9, an image inputting apparatus 60 according to the second embodiment is also exploded into the base 200, the sensor section 300, and the cover 400 principally.

As shown in FIG. 10A, two convex parts 206 and 208 are formed on the upper surface side of the base 200 (in place of the convex part 205). The convex parts 206 and 208 are convex parts formed in projecting states to the upper surface side of the base 200.

Moreover, a turned-up section 210, a part of which is turned up from the base 200 by 90° or more into the front-back direction, is formed in the base 200. Notched sections 212 and 214 are formed on the right and left sides of the turned-up section 210, and the notched sections 212 and 214 are adapted to correspond to (overlap with) the convex parts 206 and 208, respectively, in the state in which the turned-up section 210 are turned up.

As shown in FIG. 10B, the turned-up section 210 is turned up in the state of being slightly inclined to the upper surface side of the base 200 (in the state of holding a certain angle to the upper surface side of the base 200). When a pressure is applied onto the turned-up section 210 downward, the turned-up section 210 has an urging force to rebound upward so as to repel the pressure.

As shown in FIG. 11, two pattern switches 352 and 354 are formed on the upper surface side of the wired sheet 340 (in place of the dome switch 350).

Next, the operation and the operation of the image inputting apparatus 60 will be described.

Figure 12A:
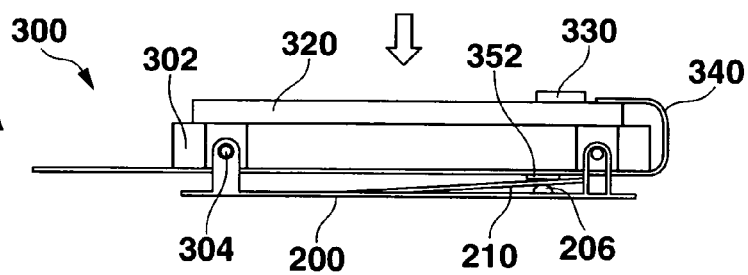
FIG. 12A is a view for illustrating the operation and the operation of the image inputting apparatus of the second embodiment.

As shown in FIG. 12A, in the state in which the base 200 is attached to the sensor section 300, the turned-up section 210 of the base 200 abuts against the back light section 302 to urge the back light section 302 upward, and the pattern switches 352 and 354 of the sensor section 300 face to the convex parts 206 and 208, respectively, in a slightly separated state.

Figure 12B:
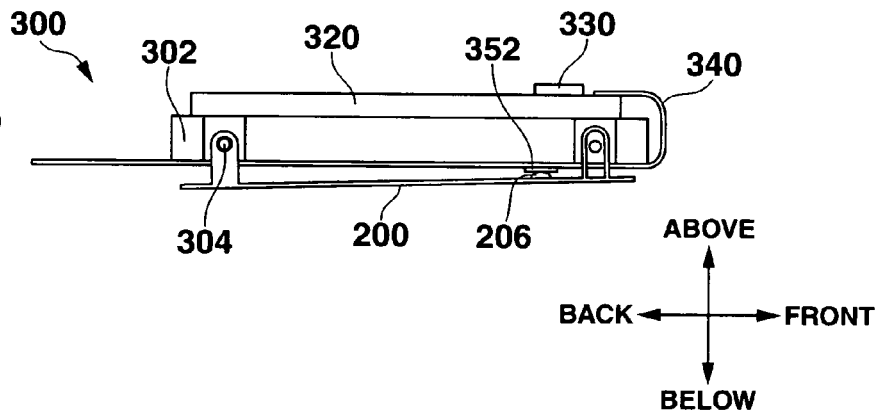
FIG. 12B is a view for illustrating the operation and the operation in the image inputting apparatus of the second embodiment.

In this state, when a subject touches the upper surface side of the sensor chip 320 with a finger or the like to push down the sensor section 300 with the finger or the like, the sensor section 300 rotates downward around the shafts 304 and 306 as fulcrums, being against the urging force of the turned-up section 210 of the base 200. As shown in FIG. 12B, when the sensor section 300 is pushed down, the pattern switches 352 and 354 touch he convex parts 206 and 208, respectively. When the two convex parts 206 and 208 touch the pattern switches 352 and 354, respectively, the electric contact point sections (not shown) of the pattern switches 352 and 354 each become a state capable of conducting electricity, and a signal indicating the effect is output from the pattern switches 352 and 354 to a controller (not shown) through the wiring of the wired sheet 340.

Then, when the subject detaches the finger from the sensor chip 320, the pattern switches 352 and 354 are released from the touching with the convex parts 206 and 208, respectively, by receiving the upward urging force of the turned-up section 210 of the base 200, and the sensor section 300 is rotated upward.

According to the present embodiment described above, a part of the base 200 is turned up as the turned-up section 210, and urges the sensor main body 301 upward (the turned-up section 210 functions as a spring). Consequently, no dedicated switching parts such as the dome switch 350 are needed for realizing the switching operation, and the urging force to the sensor main body 301 can be controlled by the degree of the turned-up of the turned-up section 210.

Incidentally, the present invention is not limited to the embodiment described above, but the various changes of the design of the embodiment described above are included in the scope of the present invention. For example, the changes of the design of the first embodiment cited in the first to third modifications may be applied to the image inputting apparatus 60 of the second embodiment described above, and the following modification may be applied to the image inputting apparatus 60.

[Modification]

Figure 13A:
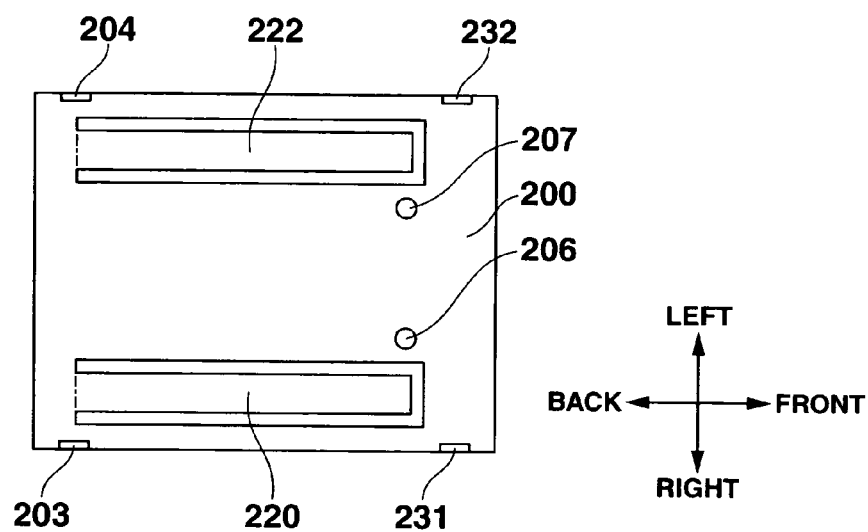
FIG. 13A is a plan view showing a modification of the base shown in FIGS. 10A and 10B.
Figure 13B:
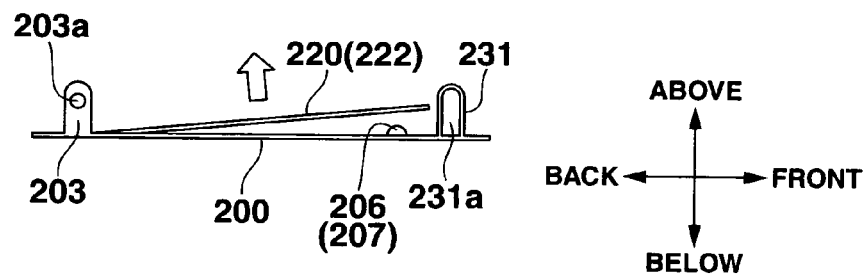
FIG. 13B is a side view showing the modification of the base shown in FIGS. 10A and 10B.

The base 200 shown in FIGS. 13A and 13B are used in place of the base 200 shown in FIGS. 10A and 10B.

In the base 200 shown in FIGS. 13A and 13B, bent sections 220 and 222 are formed in place of the turned-up section 210. As shown in FIG. 13A, the bent sections 220 and 222 is formed in a shape in which a part of the base 200 is cut out from the base 200 on the right and left sides thereof in the front-back direction thereof. As shown in FIG. 13B, the rear end parts of the bent sections 220 and 222 are integrated with the base 200, and their front end parts are slightly bent upward (less than 90° to the base 200). Then, in the state in which the base 200 is attached to the sensor section 300, the bent sections 220 and 222 are adapted to abut against the back light section 302 to urge the back light section 302 upward.

Also in this case, parts of the base 200 are bent as the bent sections 220 and 222, and the bent sections 220 and 222 urge the sensor main body 301 upward (function as springs). Consequently, the sensing operation can be realized without using the dedicated switching part such as the dome switch 350, and the urging force to the sensor main body 301 can be also controlled by the degree of the bending of the bent sections 220 and 222.

Third Embodiment

A third embodiment differs from the first embodiment in the following points, and the other points of the third embodiment are similar to those of the first embodiment.

Figure 14:
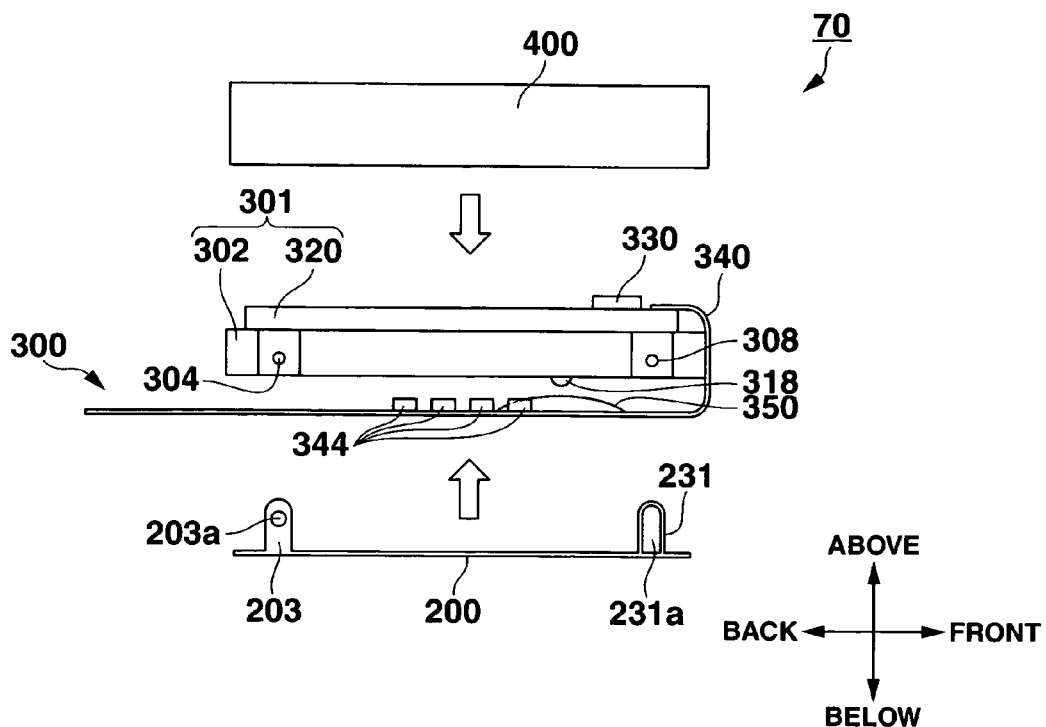
FIG. 14 is an exploded side view showing an image inputting apparatus of a third embodiment of the present invention.

As shown in FIG. 14, also an image inputting apparatus 70 according to the third embodiment is principally exploded into the base 200, the sensor section 300, and the cover 400.

The convex part 205 is not formed on the base 200, and a member corresponding to the convex part 205 is formed on the lower surface side of the back light section 302 as a convex part 318.

Figures 15A, 15B:
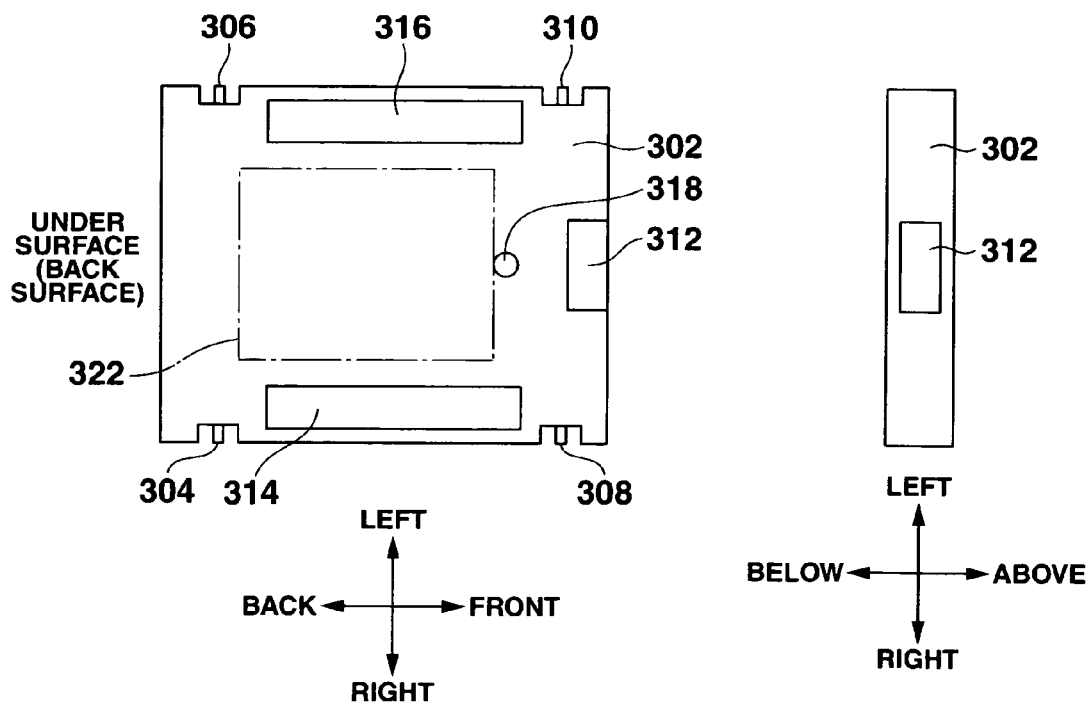
FIG. 15A is a back surface view showing a back light section provided in the image inputting apparatus of the third embodiment.
FIG. 15B is a front side view showing the back light section provided in the image inputting apparatus of the third embodiment.

As shown in FIGS. 15A and 15B, the concave part 312 is formed at the front side of the back light section 302, and the concave part 312 is opened forward.

Figure 16:
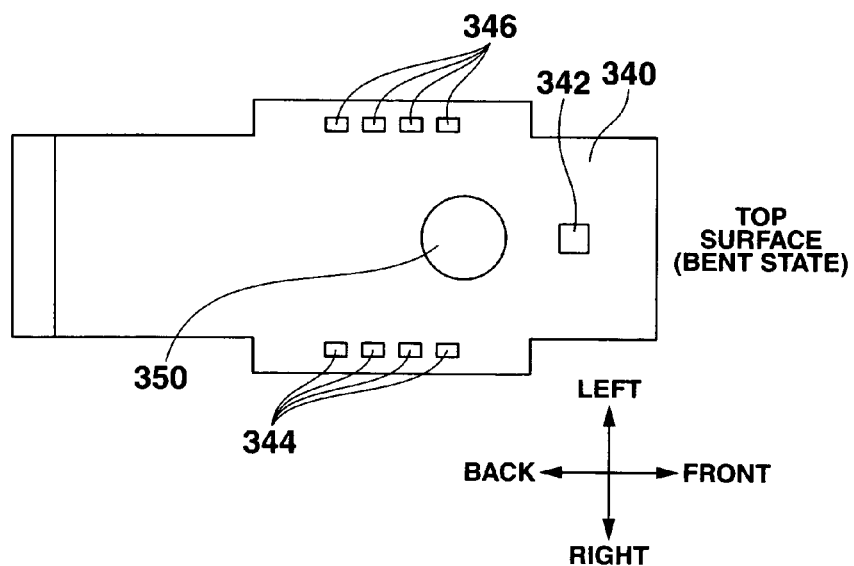
FIG. 16 is a back surface view of a wired sheet provided in the image inputting apparatus of the third embodiment.

As shown in FIG. 16, the dome switch 350 is provided on the lower surface side of the wired sheet 340.

Figure 17:
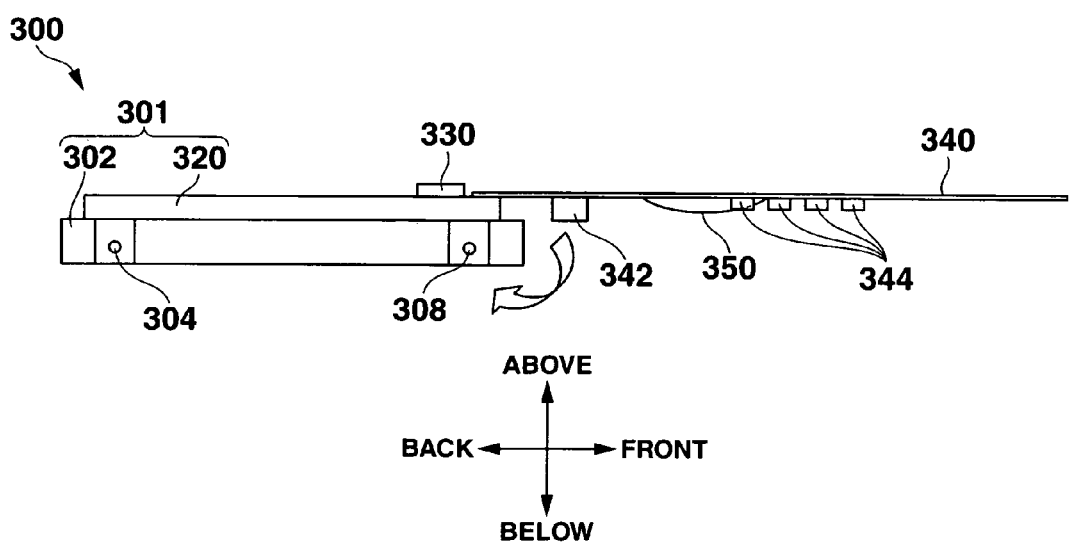
FIG. 17 is a side view of a sensor section provided in the image inputting apparatus of the third embodiment showing a state before a bend of the wired sheet.
Figure 18:
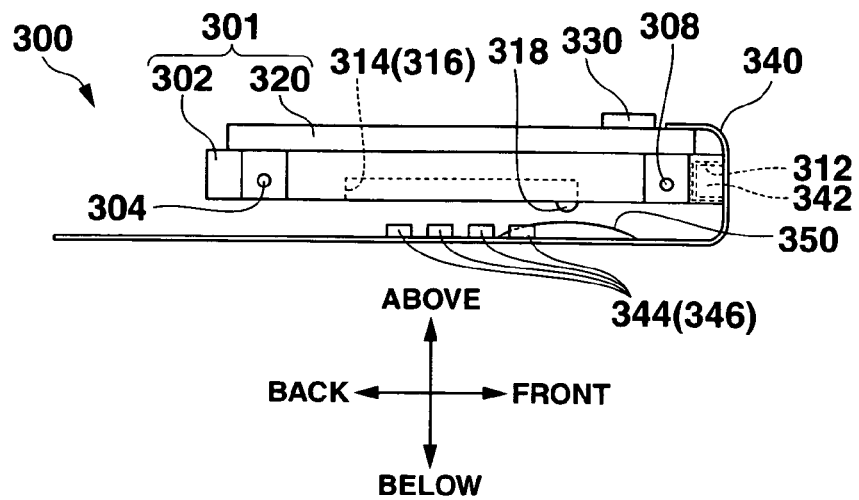
FIG. 18 is a side view of the sensor section provided in the image inputting apparatus in the third embodiment showing a state after the bend of the wired sheet.

When the wired sheet 340 is attached to the sensor section 300, as shown in FIG. 17, the wired sheet 340 is bent downward from the upper part to be stuck to the lower surface side of the back light section 302 with the front end part (see FIG. 16) of the wired sheet 340 stuck to the sensor chip 320. At this time, as shown in FIG. 18, the light emitting diode 342 of the wired sheet 340 is fitted and housed in the concave part 312 of the back light section 302, and the dome switch 350 faces to the convex part 318.

Next, the operation and the operation of the image inputting apparatus 70 will be described.

In the state in which the base 200 is attached to the sensor section 300, the dome switch 350 faces to the convex part 318 in the state of abutting against the convex part 318.

In this state, when a subject touches the upper surface side of the sensor chip 320 with a finger or the like to push down the sensor section 300 with the finger or the like, the sensor section 300 rotates downward around the shafts 304 and 306 as fulcrums. When the sensor section 300 is pushed down, the convex part 318 is received by the dome switch 350, and the dome switch 350 is depressed by the convex part 318. When the dome switch 350 is pushed, the electric contact point section (not shown) of the dome switch 350 becomes a state capable of conducting electricity, and a signal indicating the effect is output from the dome switch 350 to a controller (not shown) through the wiring of the wired sheet 340.

Then, when the subject detaches the finger from the sensor chip 320, the dome switch 350 is restored to the original state, and the sensor section 300 is rotated upward by the restoration of the dome switch 350.

According to the present embodiment described above, the concave part 312 of the back light section 302 is formed on the front side surface thereof, and the light emitting diode 342 is housed in the concave part 312. Consequently, the light of the light emitting diode 342 propagates from the side of the back light section 302 in the plane surface state, and the light quantity of the light emitted from the upper part of the back light section 302 can be uniformed over the whole sensing area 322.

Moreover, because all of the light emitting diode 342, the electronic part group 344 and 346, and the dome switch 350 are mounted on the same surface of the wired sheet 340 the same surface (mounted on one side), the manufacture of the image inputting apparatus 70 is easier than the manufacture thereof in the case where all of the light emitting diode 342, the electronic part group 344 and 346, and the dome switch 350 are mounted on separate surfaces, and consequently the manufacturing cost thereof can be reduced.

Incidentally, the present invention is not limited to the embodiment described above, but the various changes of the design of the embodiment described above are included in the scope of the present invention. For example, the changes of the designs cited in the first to the third modifications of the first embodiment may be applied to the image inputting apparatus 70 of the third embodiment.

Fourth Embodiment

Figure 19:
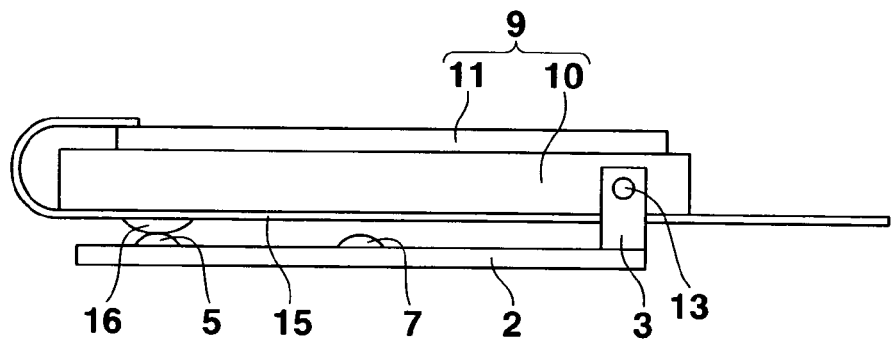
FIG. 19 is right side view showing an image inputting apparatus in a fourth embodiment of the present invention.
Figure 20:
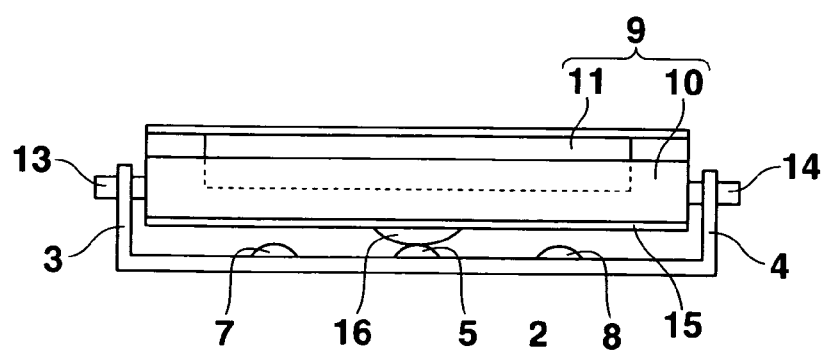
FIG. 20 is a rear view showing the image inputting apparatus of the fourth embodiment.

FIG. 19 is a right side view showing an image inputting apparatus 1 of a fourth embodiment of the present invention. FIG. 20 is a rear view of the image inputting apparatus 1.

As shown in FIGS. 19 and 20, a base 2 is a plate-like or a thin plate-like member, and the upper surface side and the lower surface side of the base 2 are formed to be in parallel to each other. Supporting sections 3 and 4 are each provided on both the sides of the upper surface side of the base 2 near the rear thereof, and the supporting sections 3 and 4 are each provided in a standing state on the upper surface side of the base 2.

A shaft hole pierces the supporting section 3 in a right-left direction, and a shaft hole also pierces the supporting section 4 in the right-left direction. The shaft holes of the supporting sections 3 and 4 are concentric in view of the right-left direction.

A convex part 5 and sensor receiving sections 7 and 8 are formed on the upper surface side of the base 2. The convex part 5 and sensor receiving sections 7 and 8 are projections formed on the upper surface side of the base 2 in projecting states from the upper surface side. The shapes of the sensor receiving sections 7 and 8 at the time when they are looked at from above are ellipses each having the major shaft in a front-back direction and the minor shaft in a right-left direction. The projection heights of the sensor receiving sections 7 and 8 are the same.

The convex part 5 is formed at the front part of the base 2, and the sensor receiving sections 7 and 8 are formed at the rear to the convex part 5. The sensor receiving sections 7 and 8 are formed between the supporting section 3 and the convex part 5 when they are looked at in the right-left direction. Moreover, the convex part 5 is formed at the central part of the right and the left sides of the base 2 when they are looked at in the front-back direction, and the convex part 5 is formed between the sensor receiving sections 7 and 8, and more particularly at the center of them, when they are looked at in the front-back direction.

A sensor main body 9 is coupled to the supporting sections 3 and 4 in the state capable of being rotated in the vertical direction. The sensor main body 9 includes a chassis 10 made of a resin, and a sensor chip 11 mounted on the chassis 10. Shafts 13 and 14 are formed on both the sides of the chassis 10 near the rear thereof. The shaft 13 is inserted into the shaft hole of the supporting section 3, and the shaft 14 is inserted into the shaft hole of the supporting section 4. The supporting of the shafts 13 and 14 by the supporting sections 3 and 4, respectively, in such a way enables the rotation of the sensor main body 9 to the base 2 in the vertical direction. The rotation shaft center of the sensor main body 9 is the center line of the shafts 13 and 14, and extends in the right-left direction. Incidentally, the shafts 13 and 14 are provided in the chassis 10, and shaft holes are formed in the supporting sections 3 and 4. But, shafts may be adversely formed in the supporting sections 3 and 4, and the shaft holes may be formed in the chassis 10.

The sensor chip 11 is mounted on the chassis 10, and the lower surface side of the chassis 10 and the upper surface side of the sensor chip 11 are parallel to each other.

The sensor chip 11 is a contact type sensor, the upper surface side of which is made to be a sensor surface, and picks up the form of the surface (such as a pattern of irregularities (a fingerprint in the case where the testing object is a finger)) of a testing object touching the upper surface side or the form of the inner part (such as a vein pattern in a finger in the case where a testing object is a finger) of the testing object touching the upper surface side as an image to input the image. As a sensor chip 11, sensors sense the surface or internal morphology of a testing object by an optical, an electrical capacitance, and electric field, a thermal, a pressure sensitive, an ultrasonic, and the other systems.

A flexible wired sheet 15 is connected to a front end part on the upper surface side of the sensor chip 11. The wired sheet 15 is bent from the front end part on the upper surface side of the sensor chip 11 to the lower surface side to be wired to the rear of the chassis 10. The wired sheet 15 is then stuck onto the lower surface side of the chassis 10.

The wired sheet 15 is made of laminated insulation films and wiring patterned between the layers to drive the sensor. The wiring formed on the wired sheet 15 is connected to a terminal of the sensor chip 11 to enable the sensor chip 11 to be conducted.

A push switch 16 is provided on the lower surface side of the sensor main body 9 to be disposed at the central part in the right-left direction of the sensor main body 9 at the time of being looked at from the front-back direction thereof. To put it concretely, the push switch 16 is attached to the wired sheet 15, and the push switch 16 is formed at the position corresponding to the convex part 5. The push switch 16 is a push switch, such as a dome switch, a tactile switch, a push button switch, and the other type switches, which has a restoring force to restitute from a pushed state.

Figure 21:
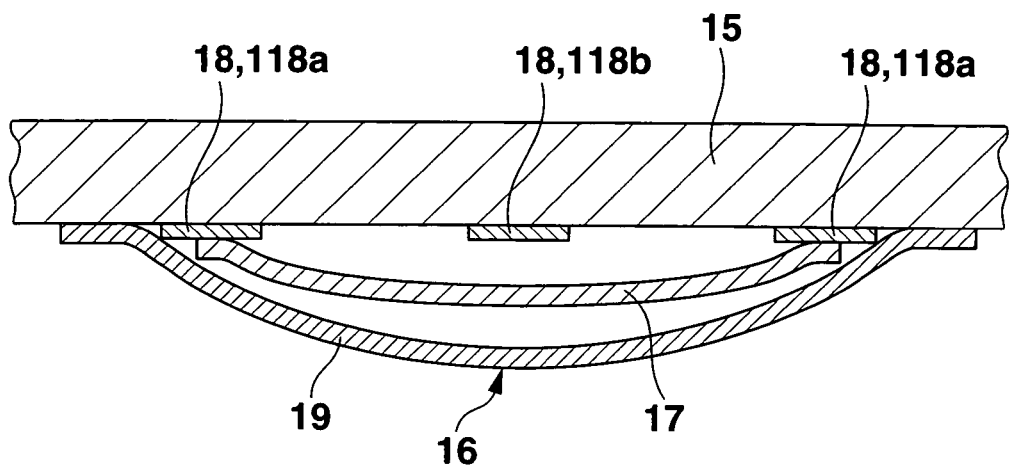
FIG. 21 is a sectional view principally showing a switch provided in the image inputting apparatus of the fourth embodiment.
Figure 22:
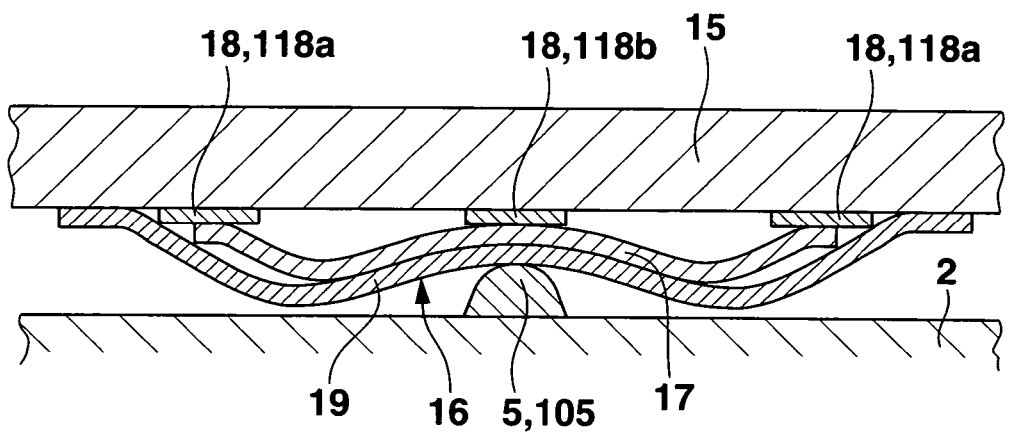
FIG. 22 is a sectional view showing the switch in a pushed state.

If the push switch 16 is the dome switch, then the push switch 16 includes a conductive elastic material 17 formed in a dome to be convex downward, a plurality of electric contact point sections 18 provided on the inside of the elastic material 17, and an insulative elastic material 19 provided so as to cover the elastic material 17, as shown in FIG. 21. As shown in FIG. 22, when the elastic materials 17 and 19 are pushed, the elastic materials 17 and 19 are elastically deformed, so that the elastic material 17 touches the electric contact point sections 18. Thereby, these electric contact point sections 18 each become a state capable of conducting electricity. When the depressing of the elastic materials 17 and 19 is released, the elastic materials 17 and 19 restores to their original dome shapes. Incidentally, the electric contact point sections 18 are in the state capable of conducting electricity to the wiring of the wired sheet 15.

The installation positions of the convex part 5, the sensor receiving sections 7 and 8, the push switch 16, and the sensor chip 11 will be described.

Any of the convex part 5 and the sensor receiving sections 7 and 8 is formed at a position to overlap with the position where no wiring is formed on the wired sheet 15, that is, a position to overlap with the position between the pieces of wiring, when it is looked at from above.

Any of the convex part 5 and the sensor receiving sections 7 and 8 is formed at a position to be out of the sensing area on the upper surface side of the sensor chip 11 when it is looked at from above. Incidentally, the sensing area is an area that the sensor chip 11 can sense, and the sensor chip 11 cannot perform sensing on the outside of the sensing area.

The convex part 5 is formed at the position corresponding to the central part in the right-left direction of the sensor chip 11.

The sensor receiving sections 7 and 8 are formed between the rotation shaft center (shafts 13 and 14) of the sensor main body 9, and the push switch 16 or the contact surface of the push switch 16 in a radial direction of the rotation of the sensor main body 9.

Next, the operation and the operation of the image inputting apparatus 1 will be described.

When a subject touches the upper surface side of the sensor chip 11 with a finger or the like to push down the sensor main body 9 with the finger or the like, the sensor main body 9 rotates downward around the shafts 13 and 14 as fulcrums. When the sensor main body 9 is pushed down, the push switch 16 is received by the convex part 5, and the push switch 16 is further pushed by the convex part 5. When the push switch 16 is pushed, the electric contact point sections 18 of the push switch 16 each become a state capable of conducting electricity, and consequently a signal is output from the push switch 16 to a control circuit through the wiring of the wired sheet 15. The sensor chip 11 is driven by the control circuit by means of the signal as a trigger, and the surface or internal morphology of a finger or the like is taken in as an image by the sensor chip 11.

Then, when the subject detaches the finger from the sensor chip 11, the push switch 16 is restored to the original state, and the sensor main body 9 is rotated upward by the restoration of the push switch 16.

Figure 23:
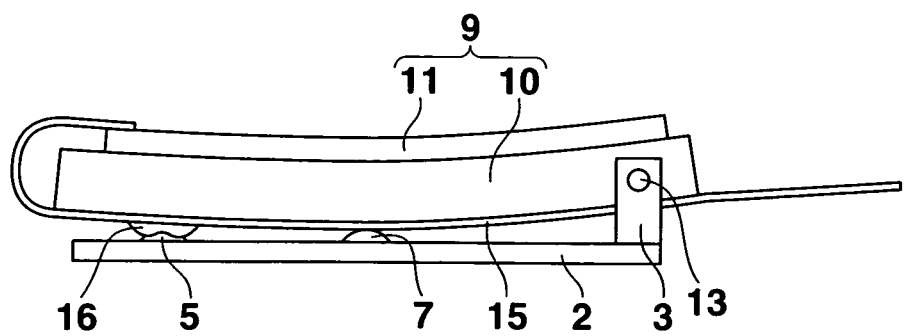
FIG. 23 is a right side view showing the sensor main body provided in the image inputting apparatus of the fourth embodiment in a state of being pushed in downward.

According to the present embodiment, as shown in FIG. 23, when the subject further depresses the sensor main body 9 downward in the state in which the push switch 16 is pushed by the convex part 5, the sensor body 9 is bent downward although slightly. In this case, because the lower surface side of the bent sensor main body 9 is received by the sensor receiving sections 7 and 8, the sensor main body 9 is not largely deformed, even if the sensor chip 11 and the chassis 10 are designed to be thin types. Consequently, the sensor chip 11 and the chassis 10 can be protected from downward load. Then, the sensor chip 11 and the chassis 10 can be further miniaturized, and their weights can be saved.

Moreover, because the sensor receiving sections 7 and 8 are formed at the positions that overlap with the parts where no wiring is formed on the wired sheet 15, the wiring of the inner part of the wired sheet 15 is not pushed by the sensor receiving sections 7 and 8 even if the sensor receiving sections 7 and 8 the wired sheet 15 when the sensor main body 9 is pushed down. Consequently, the snapping the wiring can be surely prevented.

Moreover, because the convex part 5 and the sensor receiving sections 7 and 8 are formed at the positions to be out of the sensing area of the sensor chip 11, the reduction of the sensing performance of the sensor chip 11 caused by the abutting of the convex part 5 and the sensor receiving sections 7 and 8 when the sensor main body 9 is pushed down.

Moreover, because the sensor main body 9 is supported at three points of the convex part 5 and the sensor receiving sections 7 and 8, the sensor main body 9 is stable even in a state in which the sensor main body 9 is pushed. In particular, because the disposition positions of the convex part 5 and the sensor receiving sections 7 and 8 are devised, their stability is superior. Consequently, the damages of the sensor main body 9 can be more prevented.

Incidentally, the present invention is not limited to the embodiment described above, but the various changes of the design of the embodiment described above are included in the scope of the present invention. In the following, modifications will be cited, but the scope of the present invention is not limited to the following modifications. The following modifications are configured similarly to the image inputting apparatus 1 of the embodiment described above except for changed parts. Moreover, the following modifications may be combined with one another within a possible range.

[First Modification]

The position at which the push switch 16 is provided may be replaced with the position at which the convex part 5 is provided. If the push switch is provided on the upper surface side of the base 2, then the wiring other than the wired sheet 15 may be provided on the upper surface side of the base 2, and the wiring may be connected to the push switch. The convex part to be pushed in the push switch may be formed on the lower surface side of the chassis 10, or may be formed on the wired sheet 15.

[Second Modification]

Moreover, although the convex part 5 and the sensor receiving sections 7 and 8 are projections in the embodiment described above, the convex part 5 and the sensor receiving sections 7 and 8 may be convexes or convex parts of the other shapes.

[Third Modification]

Moreover, although the sensor receiving sections 7 and 8 are formed on the upper surface side of the base 2 in the embodiment, receiving sections in projecting states from the lower surface side of the chassis 10 may be formed on the lower surface side of the chassis 10 in place of the sensor receiving sections 7 and 8. Alternatively, the receiving sections in the projecting state from the lower surface side of the chassis 10 may be formed on the lower surface side of the chassis 10 in addition to the sensor receiving sections 7 and 8 formed on the upper surface side of the base 2.

[Fourth Modification]

Moreover, although the sensor main body 9 is adapted to be able to rotate in vertical direction by using the shafts 13 and 14 as the fulcrums in the embodiment described above, the sensor main body 9 may be provided in the state simply capable of linearly moving in the vertical direction. For example, a guide rod is provided to stand on the upper surface side of the base 2 in place of the supporting sections 3 and 4, and a hole pierces the chassis 10 in the vertical direction. Then, the guide rod is adapted to be in the state of being inserted in the hole. Thereby, the chassis 10 is guided by the guide rod and the hole in the vertical direction.

[Fifth Modification]

Moreover, a touch switch (touch sensor to detect a touch) may be provided on the wired sheet 15 in place of the push switch 16. In this case, an elastic material (such as a spring and a rubber) is put between the lower surface side of the chassis 10 and the base 2, and the touch switch does not touch the convex part 5 by the elastic material in a natural state (the state in which the sensor main body 9 is not pushed in). On the other hand, when the sensor main body 9 is pushed down, the elastic material is compressed, and the touch switch touches the convex part 5. Then, when the pushing to the sensor main body 9 is released, the elastic material is restored, and the touch switch is separated from the convex part 5.

[Sixth Modification]

Moreover, although the sensor chip 11 is mounted on the chassis 10 in the embodiment described above, the sensor chip 11 may not be mounted on the chassis 10, but shafts may be formed on the right and left side surfaces of the sensor chip 11 to be each coupled with the supporting sections 3 and 4. The sensor chip 11 may be thus adapted to be able to rotate in vertical direction.

Fifth Embodiment

Figure 24:
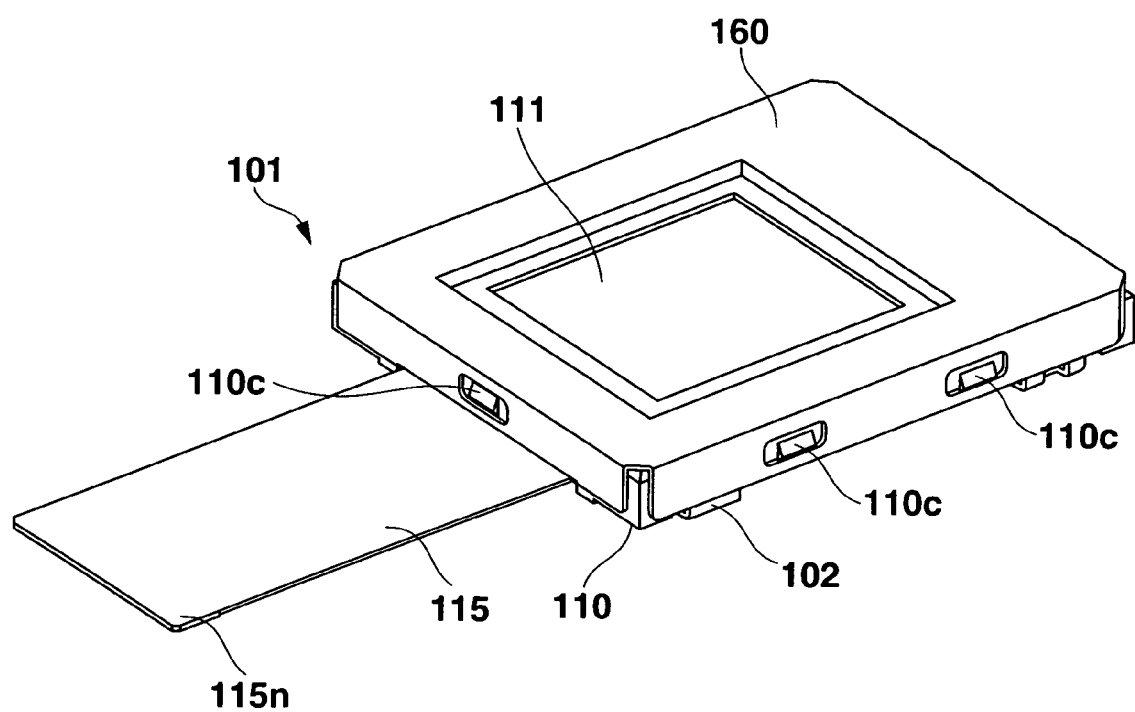
FIG. 24 is a perspective view showing an image inputting apparatus of a fifth embodiment of the present invention.
Figure 25:
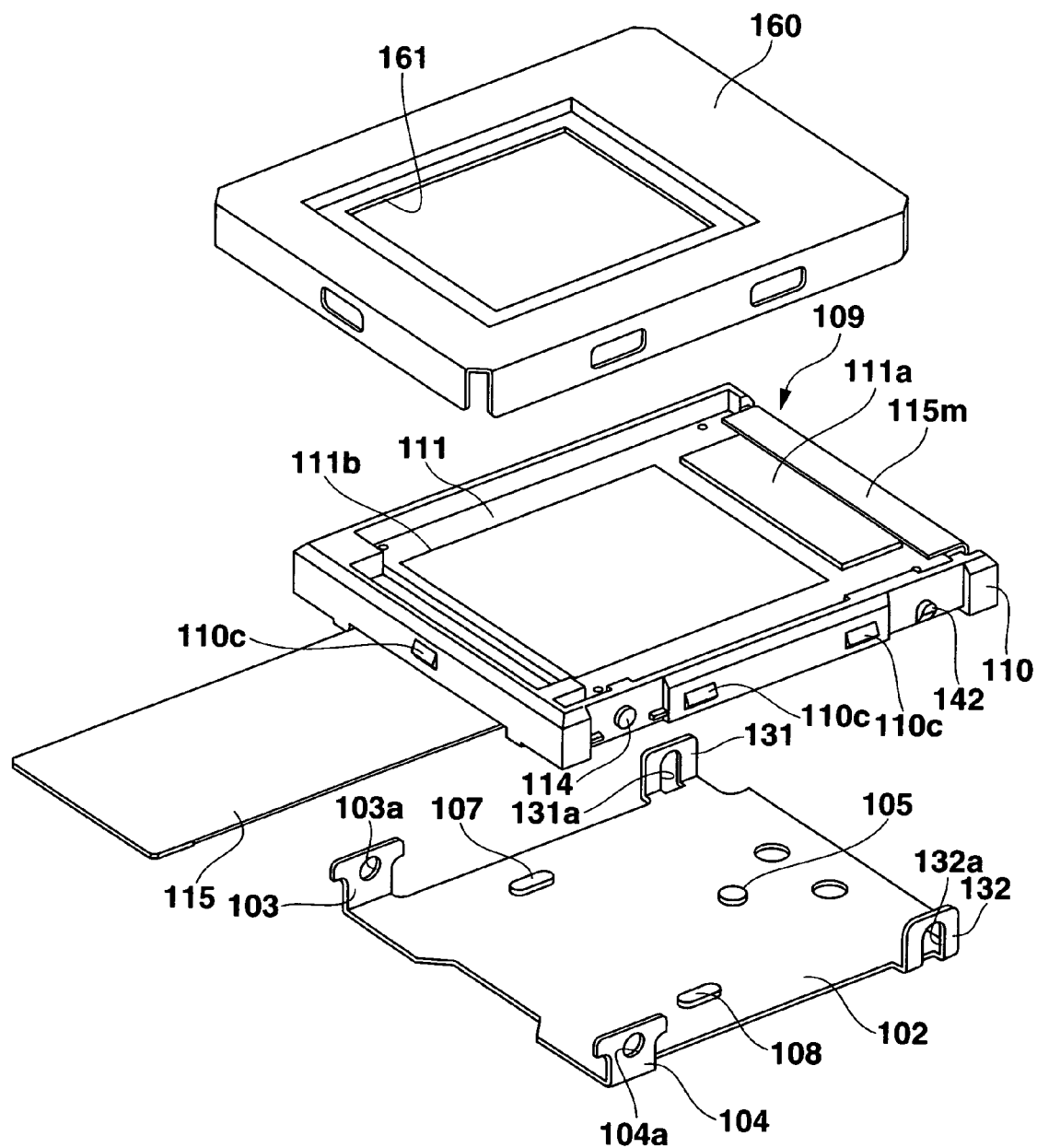
FIG. 25 is an exploded perspective view showing the image inputting apparatus of the fifth embodiment in a partially exploded state.
Figure 26:
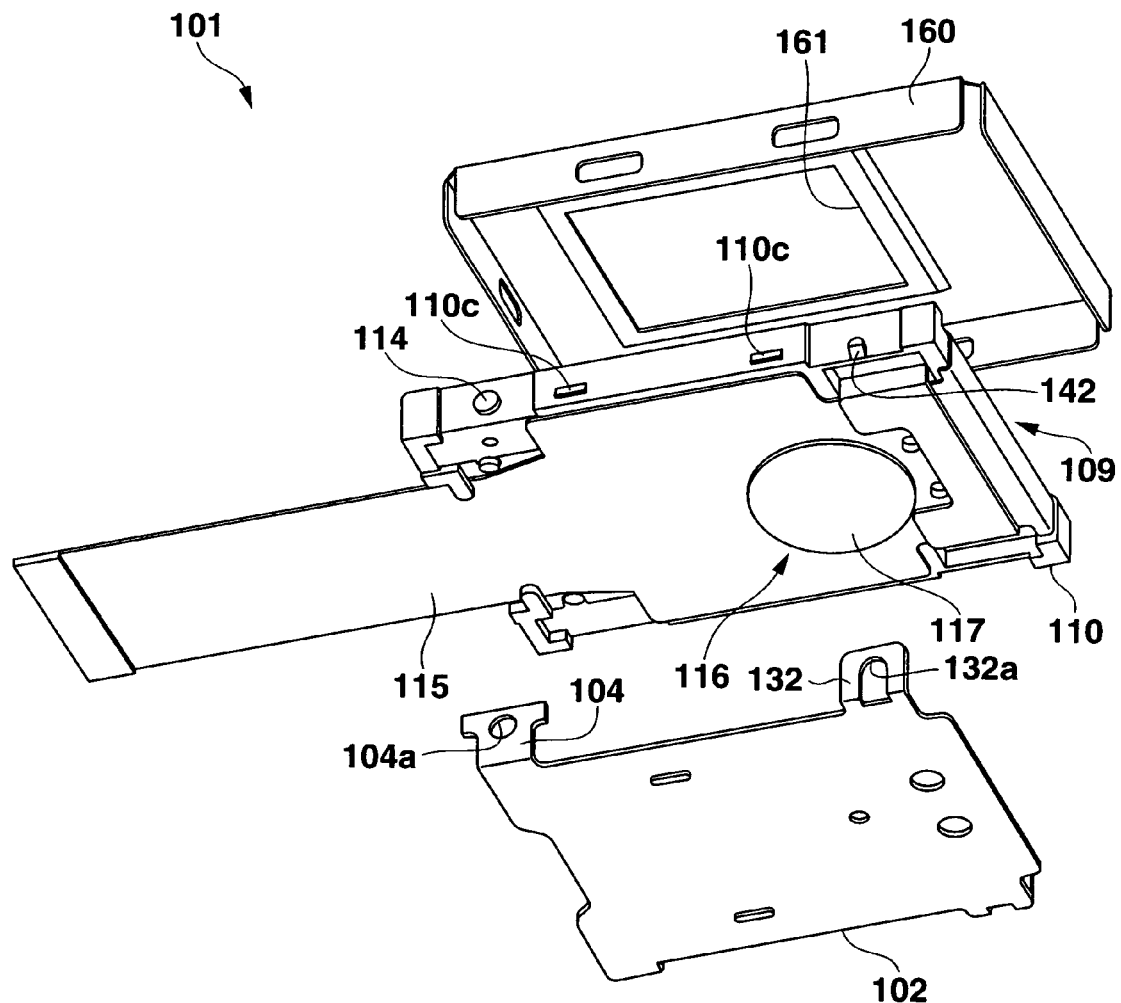
FIG. 26 is an exploded perspective view showing the image inputting apparatus looked at in a direction different from that of FIG. 25.
Figure 27:
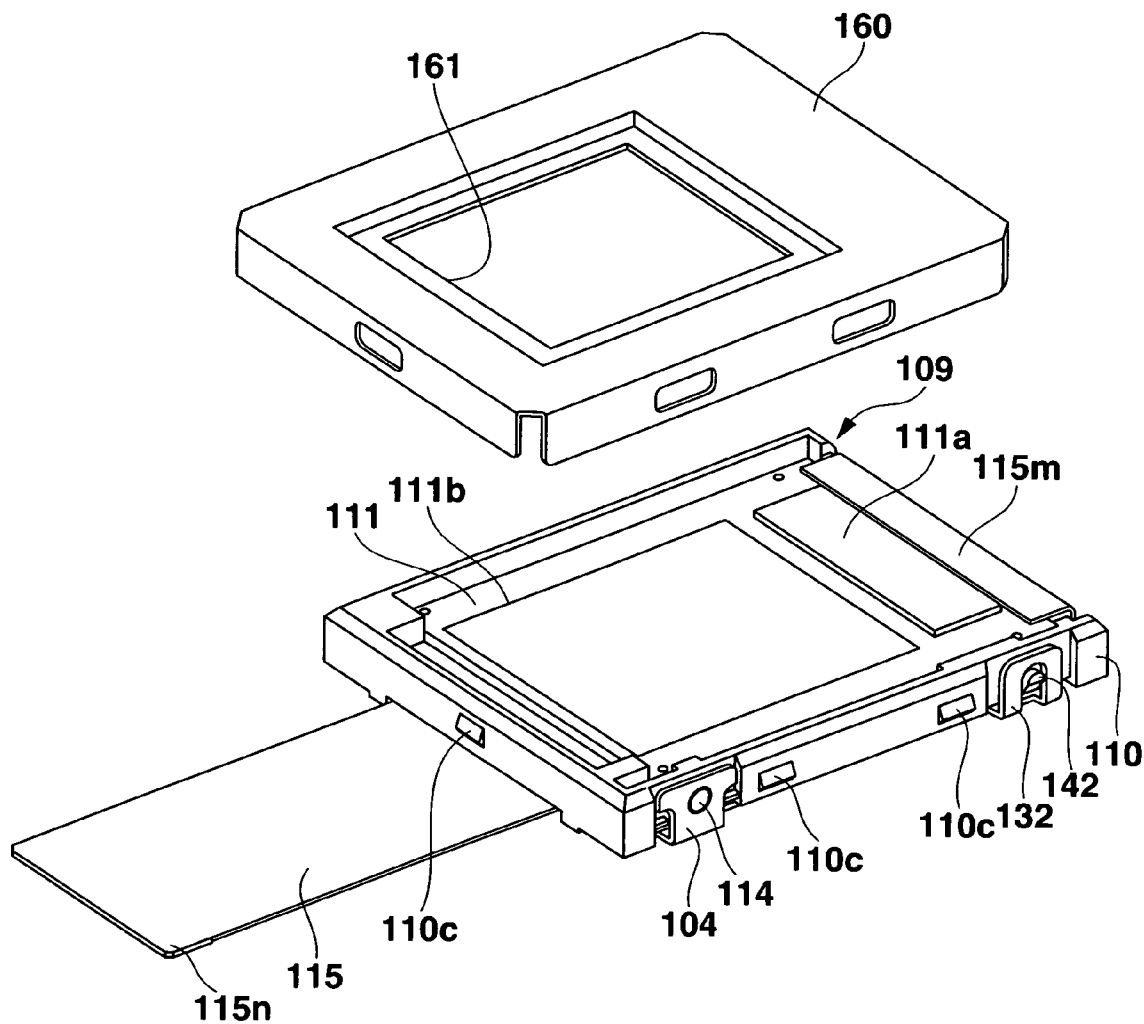
FIG. 27 is an exploded perspective view showing the image inputting apparatus of the fifth embodiment in a state of being partially exploded.
Figure 28A:
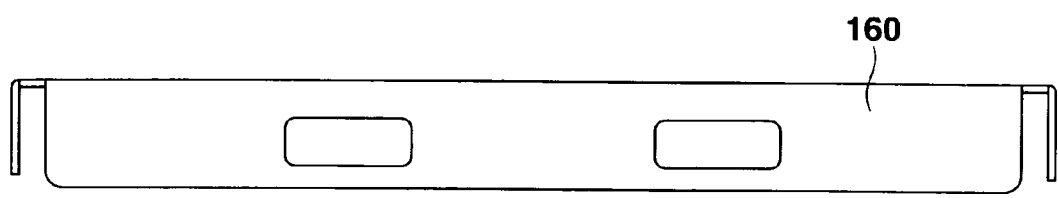
FIG. 28A is a side view showing a cover shown in FIG. 26.
Figure 28B:
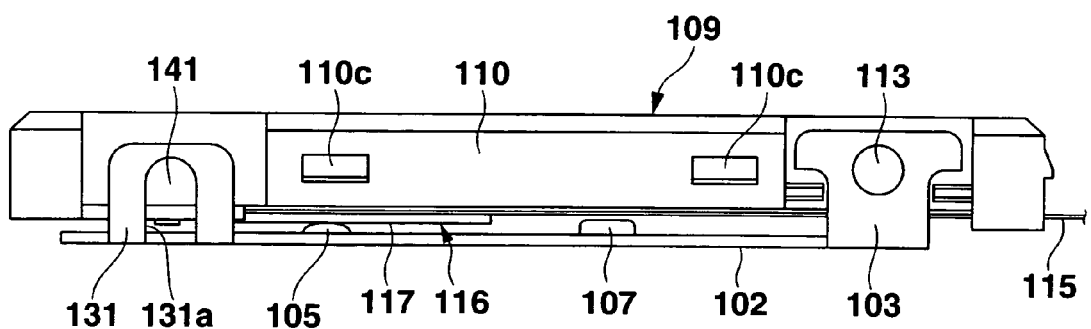
FIG. 28B is a side view showing the image inputting apparatus in a state in which the cover is removed.

FIG. 24 is a perspective view showing an image inputting apparatus 101 of a fifth embodiment of the present invention. FIG. 25 is an exploded perspective view showing the image inputting apparatus 101. FIG. 26 is an exploded perspective view shown as a view looked at from different direction from that of FIG. 25. FIG. 27 is a perspective view showing the image inputting apparatus 101 in a state in which a cover 160 is removed. FIG. 28A is a side view showing the cover 160, which has been removed from the image inputting apparatus 101. FIG. 28B is a side view showing the image inputting apparatus in the state in which the cover 160 has been removed.

As shown in FIGS. 24-27, 28A, and 28B, a base 102 is a plate-like or thin plate-like member. Supporting sections 103 and 104 are each formed on both the sides of the base 102 near the rear thereof. Guiding sections 131 and 132 are each formed on both the sides of the base 102 near the front thereof. The supporting sections 103 and 104 and the guiding sections 131 and 132A are provided in standing states from the upper surface side of the base 102.

A shaft hole 103a pierces the supporting section 103 in a right-left direction, and a shaft hole 104a pierces the supporting section 104 in the right-left direction. The shaft holes 103a and 104a are concentric in the right-left direction. Long holes 131a and 132a long in the vertical direction are formed in the guiding sections 131 and 132, respectively.

A convex part 105 and sensor receiving sections 107 and 108 are formed on the upper surface side of the base 102. The convex part 105 and the sensor receiving sections 107 and 108 are convex parts formed on the upper surface side of the base 102 in projecting states from the upper surface side. The shapes of the sensor receiving sections 107 and 108 at the time of being looked at from above are ellipses each having the major shaft in a front-back direction and the minor shaft in a right-left direction. The projection heights of the sensor receiving sections 107 and 108 are the same.

The convex part 105 is formed at the front part of the base 102, and the sensor receiving sections 107 and 108 are formed at the rear to the convex part 105. The sensor receiving sections 107 and 108 are formed between the convex part 105 and the supporting sections 103 and 104 when they are looked at in the right direction. Moreover, the convex part 105 is formed at the central part of the right and the left sides of the base 102 when they are looked at in the front-back direction, and the convex part 105 is formed between the sensor receiving sections 107 and 108, and more particularly at the center of them, when they are looked at in the front-back direction.

On the other hand, a sensor main body 109 includes a chassis 110 made of a transparent resin, and a sensor chip 111 mounted on the chassis 110. Shafts 113 and 114 are formed on both the sides of the chassis 110 near the rear thereof. The shaft 113 is inserted into the shaft hole 103a, and the shaft 114 is inserted into the shaft hole 104a. The supporting of the shafts of the shafts 113 and 114 by the supporting sections 103 and 104, respectively, in such a way enables the rotation of the sensor main body 109 to the base 102 in the vertical direction. Moreover, guided sections 141 and 142 are formed on both the side surfaces of the chassis 110 near the front thereof. The guided section 141 is inserted into the long hole 131a, and the guided section 142 is inserted into the long hole 132a. The guided sections 141 and 142 are thereby guided in the vertical direction.

A diffuser panel 133 is stuck onto the lower surface side of the chassis 110. The diffuser panel 133 is a white plate, and diffuses and reflects the light entering the surface on the side of the chassis 110. A rectangular housing concave part 110a is formed on the upper surface side of the chassis 110. The sensor chip 111 is mounted on the bottom of the housing concave part 110a.

The cover 160 covers the chassis 110 from above. A plurality of claws 110c are formed on the side surfaces of the chassis 110, and the cover 160 is fixed to the chassis 110 by latching the cover 160 together the claws 110c. A rectangular opening 161 is formed in the cover 160, and a sensing area 111b of the sensor chip 111 on the upper surface side thereof is exposed in the opening 161.

The sensor chip 111 is a contact type sensor, the upper surface side of which is made to be a sensor surface, and is a solid state image pickup device to pick up the form of the surface of a testing object (such as a finger) touching the upper surface side. In particular, the sensor chip 111 is made of pixels of double-gate transistors, which are photoelectric conversion elements, and the plurality of double-gate transistors is arranged in a matrix on a transparent glass substrate. When the sensor chip 111 is looked at from the upper surface side, a part between the double-gate transistors is transparent, and a light transmits the part between the double-gate transistors. Consequently, the sensor chip 111 is optical transparency, and is a transparent solid state image pickup device. A light entering the lower surface side of the sensor chip 111 from the lower side of the sensor chip 111 does not enter the semiconductors of the double-gate transistors, and a light entering the upper surface side of the sensor chip 111 from the upper side of the sensor chip 111 enters the semiconductors of the double-gate transistors. Incidentally, the sensing area 111b is the part where the semiconductors of the double-gate transistors are exposed to the light.

A driver 111a to drive the sensor chip 111 is mounted on the upper surface side of the sensor chip 111 at the front end part thereof.

One end part 115m of a flexible wired sheet 115 is connected to a front end part on the upper surface side of the sensor chip 111. The wired sheet 115 is bent from the front end part on the upper surface side of the sensor chip 111 to the lower surface side of the chassis 110 to be wired to the rear of the chassis 110. The other end part 115n of the wired sheet 115 is then connected to a controller 170 (shown in FIG. 31) formed in an IC chip.

Figure 29:
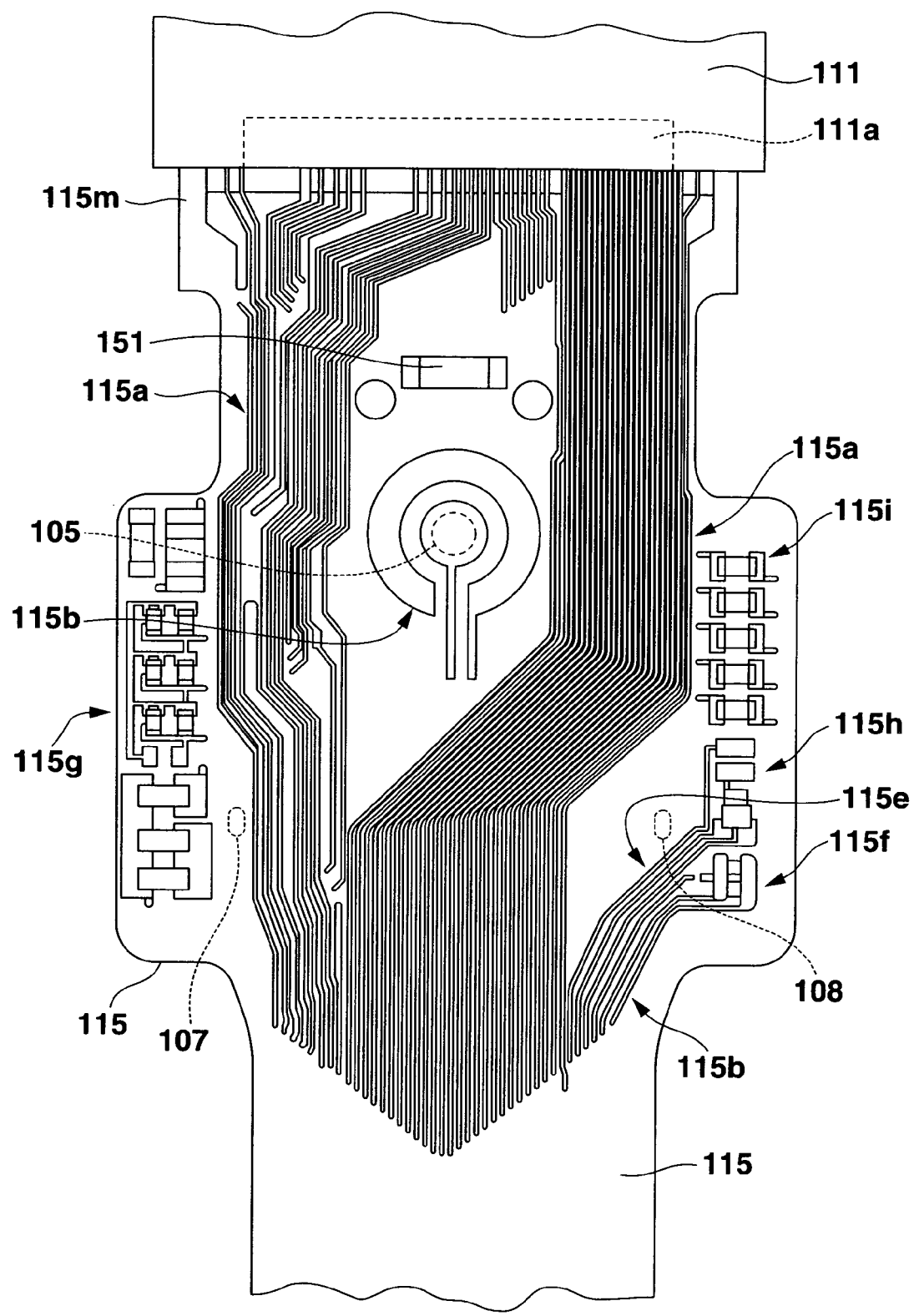
FIG. 29 is a plan view principally showing a wired sheet provided in the image inputting apparatus of the fifth embodiment.
Figure 30:
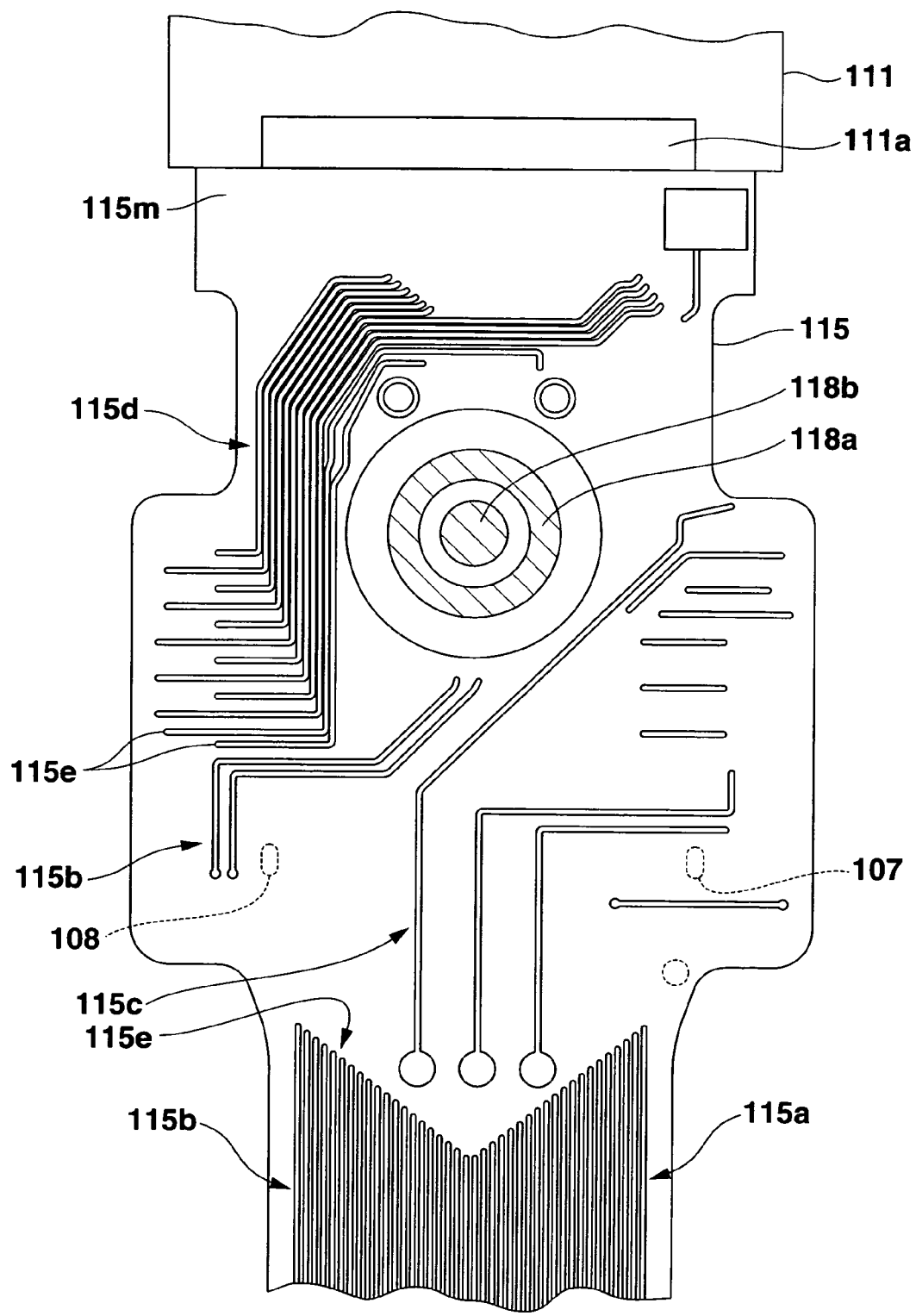
FIG. 30 is a plan view principally showing a reverse surface to the surface shown in FIG. 29.

The wired sheet 115 is made of laminated insulation films and wiring patterned between the layers. FIGS. 29 and 30 are views showing the wiring of the wired sheet 115. Here, FIG. 29 is a schematic view showing the wiring formed between the layers on the side of the chassis 110, and FIG. 30 is a schematic view showing the wiring formed between the layers on the opposite side to the chassis 110. As shown in FIGS. 29 and 30, a driver wiring group 115a, a switch wiring group 115b, a power wiring group 115c, an examination wiring group 115d, and an LED wiring group 115e are formed on the wired sheet 115. Furthermore, active element (such as a resistor and a capacitor) groups 115f, 115g, 115h, and 115i are mounted on the wired sheet 115. Furthermore, contact point sections 118a and 118b of a dome switch 116 is formed on the wired sheet 115. Moreover, a light emitting diode 151 is mounted on the wired sheet 115. Incidentally, the driver wiring group 115a, the switch wiring group 115b, the power wiring group 115c, the examination wiring group 115d, and the LED wiring group 115e are covered by an insulation film, but the contact point sections 118a and 118b are exposed.

The driver wiring group 115a is connected to the driver 111a and the active element group 115g. The switch wiring group 115b is connected to the contact point sections 118a and 118b through the active element group 115f. The power wiring group 115c is connected to the active element group 115g. The examination wiring group 115d is connected to the active element group 115i and the driver 111a. The LED wiring group 115e is connected to the light emitting diode 151 through the active element group 115h.

As shown in FIGS. 26, 28A, and 28B, the dome switch 116 is provided on the opposite side surface to the chassis 110 of both the surfaces of the wired sheet 115. The dome switch 116 includes the contact point sections 118a and 118b (shown in FIG. 30) formed on the wired sheet 115 and an elastic material 117 formed in a dome. A conductive film is formed on the inner surface of the elastic material 117, and the conductive film touches the contact point section 118a, but does not touch the contact point section 118b. Then, when the elastic material 117 is pushed down, the conductive film touches the contact point section 118b.

Figure 31:
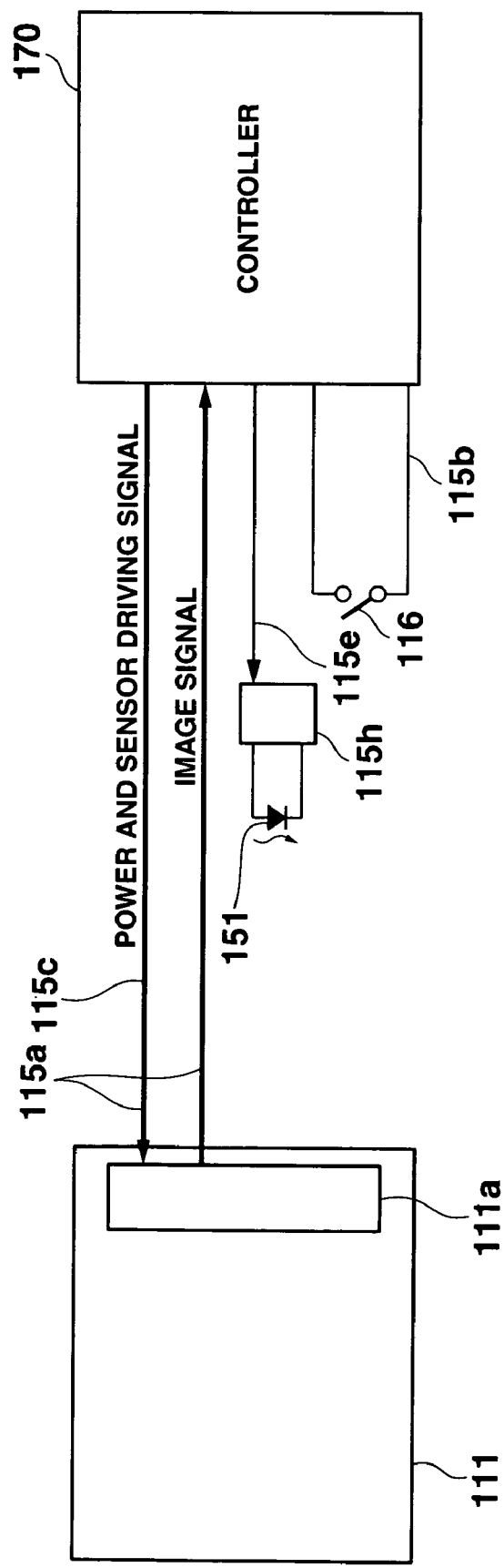
FIG. 31 is a schematic block diagram of an image inputting apparatus.

As shown in the block diagram of FIG. 31, when the dome switch 116 is pushed down, the contact point sections 118a and 118b each become a state capable of conducting electricity, and the dome switch 116 is turned on. The effect is input into the controller 170 through the switching wiring group 115b.

Moreover, the controller 170 makes the light emitting diode 151 emit a light through the LED wiring group 115e at predetermined timing.

Moreover, electric power is supplied from the controller 170 to the driver 111a of the sensor chip 111 through the power wiring group 115c and the driver wiring group 115a. Moreover, a sensor driving signal is output by the controller 170, and the sensor driving signal is input into the driver 111a through the driver wiring group 115a. The driver 111a drives the sensor chip 111 in accordance with the sensor driving signal. Thereby, the light entering each of the double-gate transistors of the sensor chip 111 is converted into an electric signal by photoelectric conversion, and consequently image pickup is performed by the sensor chip 111. The signal of an image input by the sensor chip 111 is output to the controller 170 through the driver wiring group 115a.

The installation positions of the convex part 105, the sensor receiving sections 107 and 108, the light emitting diode 151, and the sensor chip 111 will be described.

As shown in FIGS. 29 and 30, any of the sensor receiving sections 107 and 108 is formed at a position to overlap with the position where no wiring is formed on the wired sheet 115, when it is looked at from above.

Moreover, as shown in FIG. 25, any of the convex part 105 and the sensor receiving sections 107 and 108 is formed at a position to be out of the sensing area 111b of the sensor chip 111 when it is looked at from above.

The convex part 105 is formed at the position corresponding to the central part in the right-left direction of the sensor chip 111.

As shown in FIG. 26, the dome switch 116 is provided at a position corresponding to the convex part 105, and the dome switch 116 and the convex part 105 overlap with each other when they are looked at from below.

The light emitting diode 151 is disposed ahead of the sensing area 111b of the sensor chip 111 when it is looked at from above. Furthermore, the light emitting diode 151 is disposed at the central part in the right-left direction of the sensor chip 111 when it is looked at from above.

A housing concave part is formed on the lower surface side of the chassis 110, and the light emitting diode 151 is housed in the housing concave part. Incidentally, by the light-emitting of the light emitting diode 151 toward the rear, the light enters the chassis 110 on the lower side of the sensor chip 111, and the chassis 110 functions as a light guiding member to make the light entering the chassis 110 propagate. The propagating light is diffused and reflected by the diffuser panel 133, and thereby the reflected light is emitted from the chassis 110 to enter the lower surface side of the sensor chip 111 over the whole sensing area 111b.

Next, the operation and the operation of the image inputting apparatus 101 will be described.

When a subject touches the sensing area 111b on the upper surface side of the sensor chip 11 with a finger or the like to push down the sensor main body 109 with the finger or the like, the sensor main body 109 rotates downward around the shafts 113 and 114 as fulcrums. When the sensor main body 109 is pushed down, the dome switch 116 is received by the convex part 105, and the dome switch 16 is further pushed by the convex part 105. When the dome switch 116 is pushed, the contact point sections 118a and 118b of the dome switch 116 each become a state capable of conducting electricity, and consequently a signal indicating the effect is output from the dome switch 116 to a controller 170 through the switch wiring group 115b of the wired sheet 115.

As a result, the controller 170 makes the light emitting diode 151 emit light, and outputs a sensor driving signal to the driver 111a. The sensor chip 111 is driven by the driver 111a, and the light of the light emitting diode 151 transmits the sensor chip 111 to enter the finger or the like of the subject. As a result, the finger or the like of the subject is illuminated, and an image of the finger or the like of the subject is converted into an image signal by the sensor chip 111. The image input by the sensor chip 111 is output from the driver 111a to the controller 170 through the driver wiring group 115a.

Then, when the subject detaches the finger from the sensor chip 111, the dome switch 116 is restored to the original state, and the sensor main body 109 is rotated upward by the restoration of the dome switch 16.

Incidentally, the present invention is not limited to the embodiment described above, but the various changes of the design of the embodiment described above are included in the scope of the present invention. For example, the changes of the design cited in the modifications of the fourth embodiment described above may be applied to the image inputting apparatus 101 of the fifth embodiment described above.

EXAMPLES

The sensing area 111b of the sensor chip 111 of the image inputting apparatus 101 shown in FIGS. 24-27, 28A, and 28B was pushed in with a jig, and a load was loaded on the sensor chip 111 until it was damaged. Then, the load at the time of the damage thereof was measured. Such a test was performed to a plurality of samples (image inputting apparatus 101). As a result, it was found that the sensor chips were damaged at the average load of 130.7 N (13.3 kgf).

On the other hand, similar tests were performed by a plurality of times to the image inputting apparatus that had no sensor receiving sections 107 and 108 in the image inputting apparatus 101 shown in FIGS. 24-27, 28A, and 28B. As a result, it was found that the sensor chips 111 were damaged at an average load of 69.6 N (7.1 kgf).

Consequently, it was found that the sensor chip 111 could bear higher loads in the case where the sensor receiving sections 107 and 108 were provided than the case where no such sensor receiving sections were provided.

Sixth Embodiment

Figure 32:
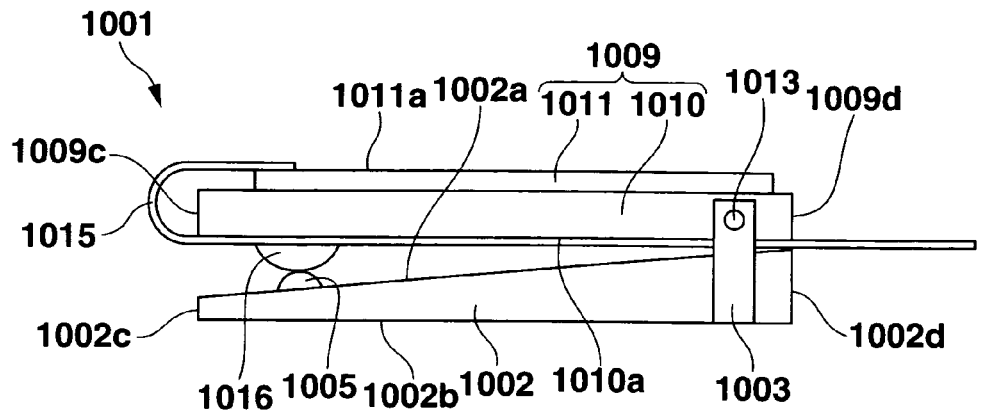
FIG. 32 is a right side view showing an image inputting apparatus of a sixth embodiment of the present invention.
Figure 33:
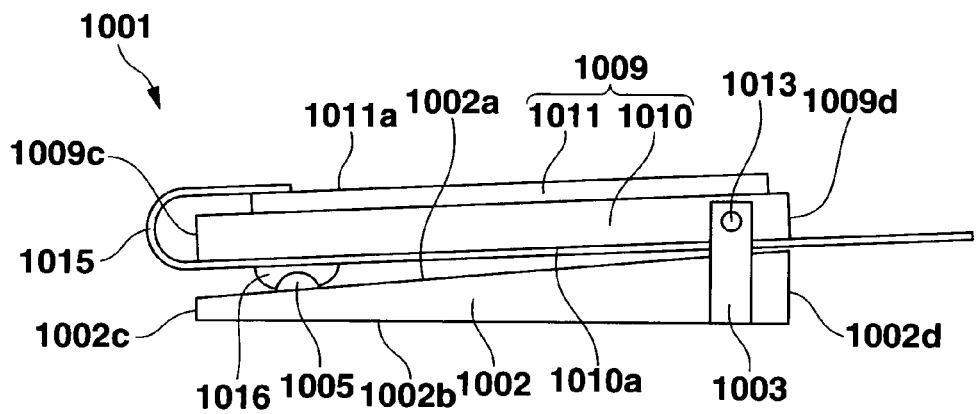
FIG. 33 is another right side view showing the image inputting apparatus of the sixth embodiment of the present invention.

FIGS. 32 and 33 are right side views showing an image inputting apparatus 1001 of a sixth embodiment of the present invention. In FIG. 32, a push switch 1016 is in its natural state here. In FIG. 33, a sensor main body 1009 is in the state in which the sensor main body 1009 is rotated downward around rotation shafts 1013, so that the push switch 1016 is pushed.

As shown in FIGS. 32 and 33, a base 1002 is a plate-like or a thin plate-like member, and the upper surface 1002a of the base 1002 and the lower surface 1002b are not in parallel to each other. Then, the upper surface 1002a is inclined to the lower surface 1002b. Consequently, the thickness of the base 1002 in the vertical direction gradually increases from the front end 1002c of the base 1002 to the rear end 1002d. Moreover, the upper surface 1011a of the sensor main body 1009 and the lower surface 1010a thereof are parallel to each other in their surface directions.

A convex part 1005 is formed on the upper surface 1002a of the base 1002 near the front end 1002c thereof. The convex part 1005 is a projection formed in a projecting state on the upper surface 1002a of the base 1002.

Supporting sections 1003 are each provided on both the side surfaces of the base 1002 near the rear end 1002d thereof. A shaft hole pierces each of the supporting sections 1003 in the right-left direction.

Rotation shafts 1013 to enable the base 1002 and the sensor main body 1009 to rotate in the vertical direction are attached to the supporting sections 1003. The sensor main body 1009 is provided with a chassis 1010 made of a resin and a sensor chip 1011 mounted on the chassis 1010. The rotation shafts 1013 are formed on both the side surfaces of the sensor main body 1009 near their rear ends 1009d, and the rotation shafts 1013 are inserted into the shaft holes of the supporting sections 1003. The supporting of the shafts of the rotation shafts 1013 by the supporting sections 1013 in such a way enables the rotation of the sensor main body 1009 to the base 1002 in the vertical direction. The rotation shaft center of the sensor main body 1009 is the center line of the rotation shafts 1013, which center line extends in the right-left direction. Incidentally, although the rotation shafts 1013 are provided on the chassis 1010 and the shaft holes are formed on the supporting sections 1013, the rotation shafts 1013 may be adversely provided in the supporting sections 1003, and the shaft holes may be formed in the chassis 1010.

The sensor chip 1011 is mounted on the chassis 1010. The lower surface 1011a of the chassis 1010 and the upper surface 1011a of the sensor chip 1011 are parallel to each other, that is, the upper surface 101a of the sensor main body 1009 and the lower surface 1010a thereof are parallel to each other.

The sensor chip 1011 is a contact type sensor using the upper surface 1011a thereof as a sensor surface, and picks up the form (such as a pattern caused by irregularities (such as a fingerprint in the case where a testing object is a finger)) of the surface of a testing object (such as the finger) touching the upper surface 1011a, or the form of the inner part (such as a vein pattern in the inner part of a finger in the case where the testing object is the finger) touching the upper surface 1011a, as an image to input the picked up image. As the sensor chip 1011, a sensor to sense the surface or internal morphology of a testing object by an optical, an electrical capacitance, an electric field, a thermal, a pressure sensitive, an ultrasonic, and the other systems can be used. Incidentally, a driver may be mounted on the outer edge of the sensor chip 1011 (such as the front end part of the sensor chip 1011).

A flexible wired sheet 1015 is connected to the front end part of the upper surface 1011a of the sensor chip 1011. The wired sheet 1015 is bent from the front end part of the upper surface 1011a of the sensor chip 1011 to the lower surface 1011a of the chassis 1010, and is wired to the rear of the chassis 1010. Then, the wired sheet 1015 is stuck to the lower surface 1011a of the chassis 1010.

The wired sheet 1015 is made of laminated insulation films and wiring pattern to drive the sensor chip 1011 between the laminated layers. The wiring formed on the wired sheet 1015 is connected to the terminal of the sensor chip 1011 to conduct electricity.

Active elements (such as transistors, diodes, and light emitting diodes) or passive elements (such as resistors and capacitors) may be mounted on the wired sheet 1015. In particular, if the sensor chip 1011 is an optically transparent solid state image pickup device that has a light exposing performance to the light entering the upper surface 1011a and a characteristic of emitting a light entering the lower surface thereof from the upper surface 1011a, then a light emitting diode is mounted on the wired sheet 1015. If the sensor chip 1011 is the optically transparent solid state image pickup device, then the chassis 1010 is transparent, and the light emitted from the light emitting diode mounted on the wired sheet 1015 transmits the chassis 1010 to enter the lower surface of the sensor chip 1011 and to be emitted from the upper surface 1011a of the sensor chip 1011.

The push switch 1016 is provided on the lower surface 1010a of the sensor main body 1009 at a position nearer to the front end than that of the rotation shafts 1013. To put it concretely, the push switch 1016 is attached to the wired sheet 1015, and the push switch 1016 is provided at a position corresponding to the convex part 1005. The push switch 1016 is a push switch of a dome switch, a tactile push switch, a push button switch, and the other push switches, and has a restoring force to restitute from a pushed state. Incidentally, if the push switch 1016 is the dome switch, the push switch 1016 includes a conductive elastic material formed in a dome to be convex downward, a plurality of electric contact point sections provided on the wired sheet 1015 on the internal side of the conductive elastic material, and an insulative elastic material provided to cover the outside of the conductive elastic material. When the conductive elastic material and the insulative elastic material are pushed, the conductive elastic material and the insulative elastic material are elastically deformed, and the conductive elastic material touches the electric contact point sections. Thereby, these electric contact point sections become the state capable of conducting electricity. When the depressing to the conductive elastic material and the insulative elastic material is released, the conductive elastic material and the insulative elastic material are restored to the original dome shape.

Because the push switch 1016 is provided at a position corresponding to the convex part 1005, as shown in FIG. 32, the push switch 1016 touches the convex part 1005 by the own weight or the like of the sensor main body 1009. If the push switch 1016 is in its natural state and is not pushed, then the upper surface 1011a of the sensor main body 1009 is parallel to the lower surface 1002b of the base 1002, and the upper surface 1002a of the base 1002 is inclined to the lower surface 1010a of the sensor main body 1009. Consequently, the upper surface 1002a of the base 1002 and the lower surface 1010a of the sensor main body 1009 form an acute angle on the rear end part side. On the other hand, as shown in FIG. 33, even if the sensor main body 1009 rotates to the side of the base 1002 and the push switch 1016 is pushed, the upper surface 1002a of the base 1002 and the lower surface 1010a of the sensor main body 1009 form an acute angle on the rear end part side.

The installation positions of the convex part 1005, the push switch 1016, and the sensor chip 1011 will be described.

The convex part 1005 is provided at a position being out of the sensing area of the upper surface 1011a of the sensor chip 1011 when the convex part 1005 is looked at from above. The sensing area is an area in which the sensing by the sensor chip 1011 can be performed, and no sensing by the sensor chip 1011 is performed on the outside of the sensing area.

The convex part 1005 is provided at a position corresponding to the central part of the sensor chip 1011 in the right-left direction.

Next, the operation and the operation of the image inputting apparatus 1001 will be described.

When a subject touches the upper surface 1011a of the sensor chip 1011 with a finger or the like to push down the sensor main body 1009 with the finger or the like, the sensor main body 1009 rotates downward around the rotation shafts 1013 as fulcrums. When the sensor main body 1009 is pushed down, the push switch 1016 is received by the convex part 1005, and the push switch 1016 is further pushed by the convex part 1005. When the push switch 1016 is pushed, the electric contact point sections of the push switch 1016 each become a state capable of conducting electricity by the conductive elastic body, and consequently the push switch 1016 is switched from its off-state to its on-state. Then, an on-signal is output from the push switch 1016 to a control circuit through the wiring of the wired sheet 1015. The sensor chip 1011 is driven by the control circuit by means of the signal as a trigger, and the surface or internal morphology of the finger or the like is taken in as an image by the sensor chip 1011.

Then, when the subject detaches the finger from the sensor chip 1011, the push switch 1016 is restored to the original state, and the sensor main body 1009 is rotated upward by the restoration of the push switch 1016. The push switch 1016 then returns to its natural state. Incidentally, when the push switch 1016 is pushed, the push switch 1016 is switched from its off-state to its on-state, but the push switch 1016 may be adversely switched from its on-state to its off-state when the push switch 1016 is separated.

According to the present embodiment, because the thickness of the base 1002 gradually increases from the front end 1002c to the rotation shafts 1013, the parts where the lower surface 1010a of the sensor main body 1009 and the upper surface 1002a of the base 1002 intersect with each other in the surface directions are situated on the side of the rotation shafts 1013 of the sensor main body 1009 and the intersection angle is formed as an acute angle in the state in which the sensor main body 1009 is pushed down. Then, when the subject further depresses the sensor main body 1009 from the state in which the push switch 1016 is pushed by the convex part 1005, the sensor main body 1009 is bent downward although it is slightly. Because the lower surface 1011a of the sensor main body 1009 and the upper surface 1002a of the base 1002 form the acute angle on the side of the rotation shafts 1013, a part of the bent lower surface 1010a of the sensor main body 1009 which part is near to the rotation shafts 1013 abuts against the upper surface 1002a of the base 1002 and is received by the upper surface 1002a. Because the lower surface 1010a of the sensor main body 1009 is supported in such a way, the sensor chip 1011 and the chassis 1010 can be protected from a downward load, and further the sensor chip 1011 and the chassis 1010 can be miniaturized and their weight can be saved. In particular, if the sensor chip 1011 uses a glass substrate as its base, such as the solid state image pickup device, then the deformation of the sensor chip 1011 can be suppressed, and the sensor chip 1011 can be protected.

Moreover, because the convex part 1005 is provided at the position to be out of the sensing area of the sensor chip 1011, the reduction of the sensing property of the sensor chip 1011 caused by the abutting of the convex part 1005 when the sensor main body 1009 is pushed down can be suppressed.

Moreover, because the upper surface 1011a of the sensor chip 1011 and the lower surface 1002b of the base 1002 are parallel to each other in the state in which the push switch 1016 is not pushed to be in its natural state, even if the base 1002 is placed on a horizontal surface or the like, no parts of the image inputting apparatus 1001 project from the horizontal surface or become hollow from the horizontal surface. Consequently, a thin shape can be realized as the whole image inputting apparatus 1001.

Seventh Embodiment

Figure 34:
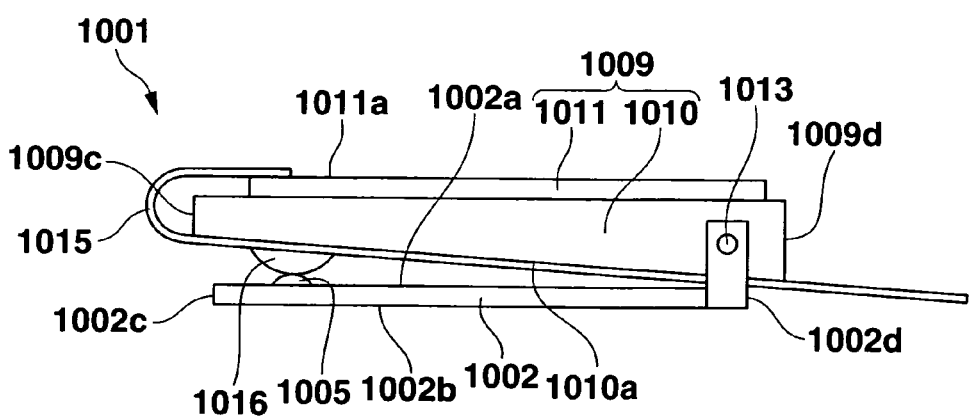
FIG. 34 is a right side view of an image inputting apparatus showing a seventh embodiment of the present invention.
Figure 35:
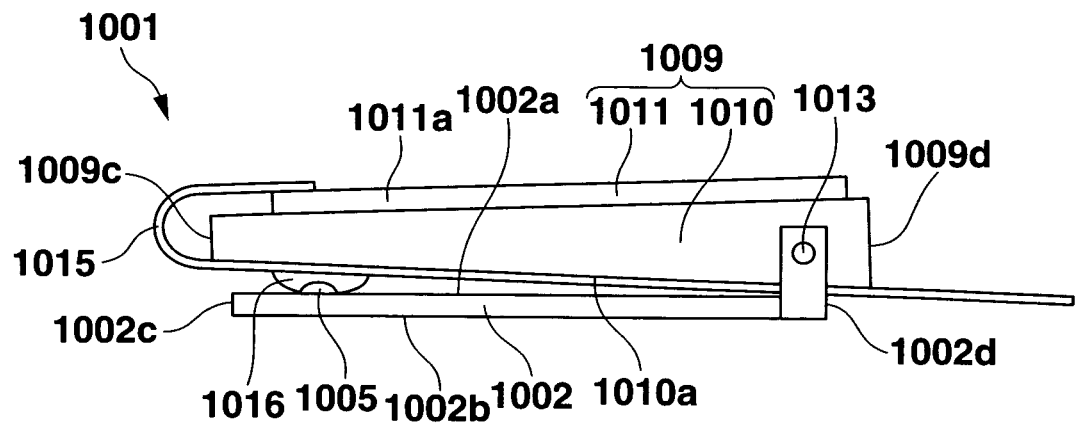
FIG. 35 is another right side view showing the image inputting apparatus of the seventh embodiment of the present invention.

FIGS. 34 and 35 are side views showing the image inputting apparatus 1001 of a seventh embodiment of the present invention. The components corresponding to each other between the image inputting apparatus 1001 shown in FIGS. 34 and 35 and the image inputting apparatus 1001 of the sixth embodiment are denoted by the same symbols here. In the following, the parts of the image inputting apparatus 1 shown in FIGS. 34 and 35 different from those of the image inputting apparatus 1001 of the sixth embodiment will be described here.

As shown in FIGS. 34 and 35, the base 1002 is a plate-like or thin plate-like flat plate, and the upper surface 1002a of the base 1002 and the lower surface 1002b thereof are parallel to each other in their surface directions. Moreover, the upper surface 1011a of the sensor main body 1009 and the lower surface 1011a thereof are not in parallel to each other, and the lower surface 1010a is inclined to the upper surface 1011a. Consequently, the thickness of the sensor main body 1009 in the vertical direction gradually increases from the front end 1009c thereof to the rear end 1009d thereof. Because the thickness of the sensor chip 1011 in the sensor main body 1009 is almost uniform, the thickness of the chassis 1010 gradually increases from the front end thereof to the rear end thereof.

In the state in which the push switch 1016 is not pushed to be in its natural state, the upper surface 1011a of the sensor main body 1009 and the lower surface 1002b of the base 1002 are parallel to each other, and the upper surface 1002a of the base 1002 is inclined to the lower surface 1010a of the sensor main body 1009. Consequently, the upper surface 1002a of the base 1002 and the lower surface 1010a of the sensor main body 1009 form an acute angle on the side of the rear end 1009d. On the other hand, as shown in FIG. 35, even in the state in which the sensor main body 1009 rotates to the side of the base 1002 and the push switch 1016 is pushed, the upper surface 1002a of the base 1002 and the lower surface 1010a of the sensor main body 1009 forms an acute angle on the side of the rear end 1009d.

Except for the contents of the above descriptions, the parts corresponding to each other between the image inputting apparatus 1001 shown in FIGS. 34 and 35 and the image inputting apparatus 1001 of the sixth embodiment are similarly configured.

Also in the image inputting apparatus 1001, when a subject pushes down the sensor main body 1009 with a finger or the like, the sensor main body 1009 is pushed downward, and the push switch 1016 is pushed by the convex part 1005. Then, the surface or internal morphology of the finger or the like is taken in as an image by the sensor chip 1011. Then, when the subject detaches the finger or the like from the sensor main body 1009, the push switch 1016 is restored to the original state, and the sensor main body 1009 is rotated upward.

Because the thickness of the sensor main body 1009 gradually increases from the front end thereof to the rotation shafts 1013, the lower surface 1010a of the sensor main body 1009 and the upper surface 1002a of the base 1002 form an acute angle in the state in which the sensor main body 1009 rotates to the side of the base 1002 and the push switch 1016 is pushed. Consequently, even if the sensor main body 1009 is slightly bent, the lower surface 1010a of the sensor main body 1009 is supported on the side of the rotation shafts 1013 in such a way. Consequently, the sensor chip 1011 and the chassis 1010 can be protected from a downward load.

Figure 36:
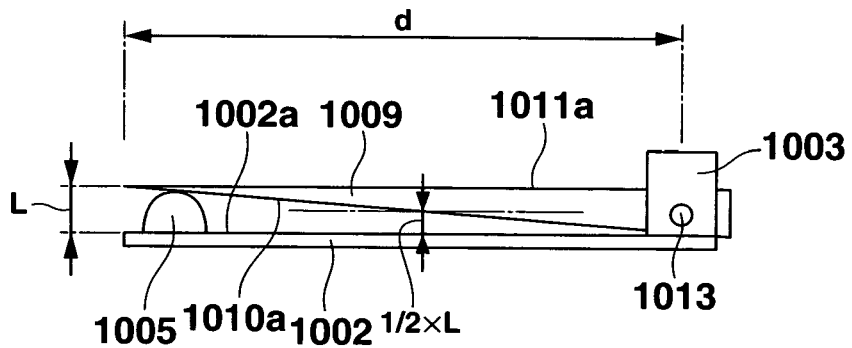
FIG. 36 is a right side view schematically showing the image inputting apparatus of the seventh embodiment in a sate in which a push switch is pushed.
Figure 37:
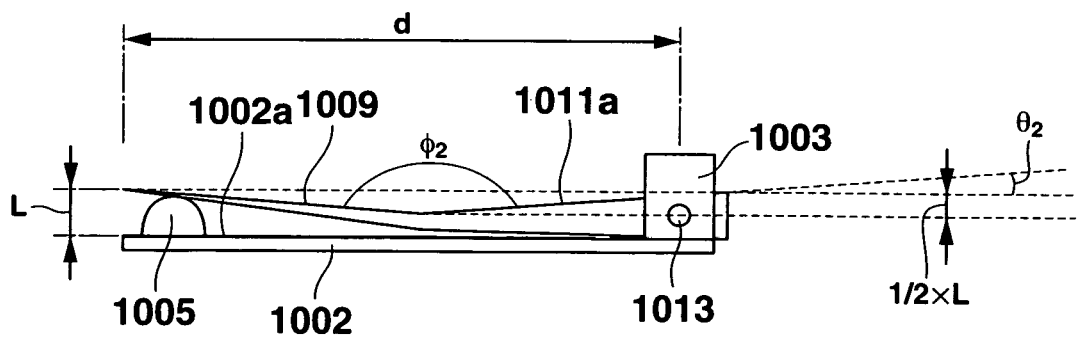
FIG. 37 is a right side view schematically showing the image inputting apparatus of the seventh embodiment in the sate in which the sensor main body bends.

To put it concretely, the situation can be considered as follows. As shown in the schematic figures of FIGS. 36 and 37, in the state in which the push switch 1016 is pushed, it is supposed that an interval between the lower surface 1010a of the sensor main body 1009 and the upper surface 1002a of the base 1002 at the front end of the sensor main body 1009 is denoted by a letter L, and that the length of the sensor main body 1009 is denoted by a letter d. When the sensor main body 1009 is further pushed down to be bent here, the sensor main body 1009 can be displaced by L/2 at the central part thereof. An angle θ2 formed by a horizontal line and the upper surface 1011a of the sensor main body 1009 can be expressed by the following formula (1).

$$\theta 2 \cong \sin(\theta 2) \cong (L/2)/(d/2) = L/d \quad (1)$$

Consequently, a bent angle φ2 of the upper surface 1011a of the sensor main body 1009 can be expressed by the following formula (2).

$$\phi 2 = \pi - 2 \times \theta 2 = \pi - 2 \times L/d \quad (2)$$

Figure 38:
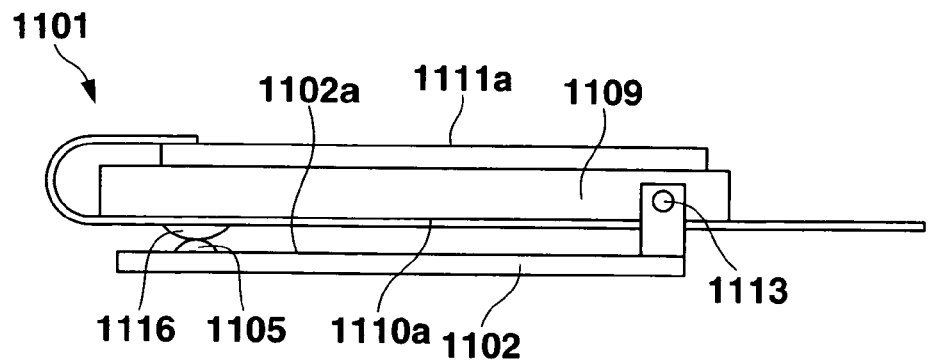
FIG. 38 is a right side view showing an image inputting apparatus of a comparative example.
Figure 39:
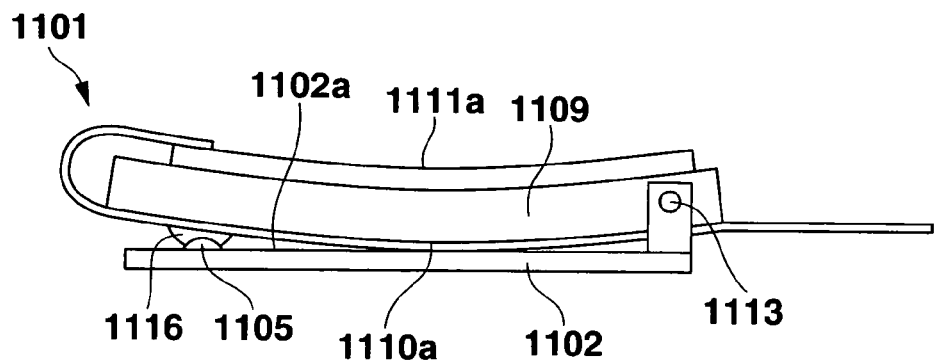
FIG. 39 is another right side view showing the image inputting apparatus of the comparative example.

On the other hand, a comparative example shown in FIGS. 38 and 39 will be examined.

Figure 40:
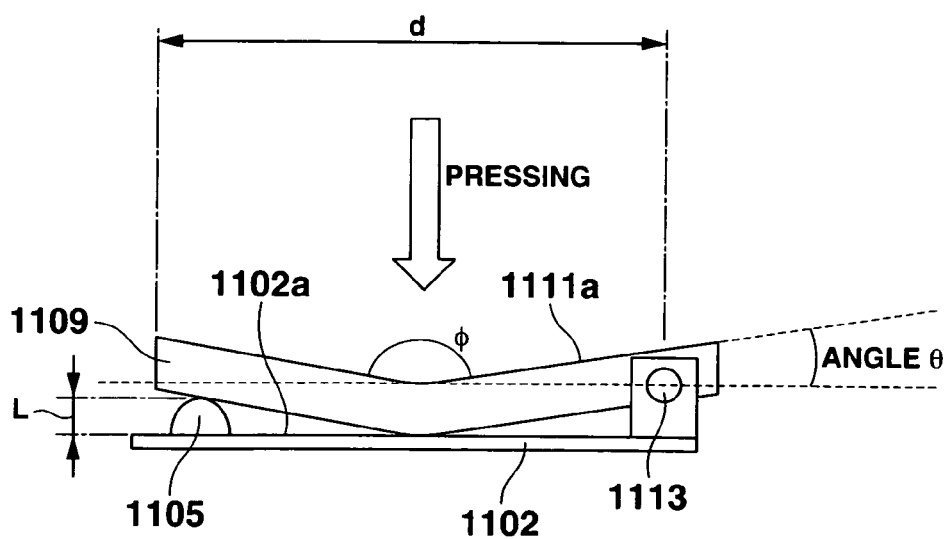
FIG. 40 is a right side view schematically showing the image inputting apparatus of the comparative example in a state in which a push switch is pushed.

In the image inputting apparatus 1101 of the comparative example, a base 1102 is a flat plate. In a state in which a push switch 1116 is not pushed, the upper surface 1111a of a sensor main body 1109 and the lower surface 1110a thereof are parallel to each other. Consequently, when the sensor main body 1109 is pushed down and the sensor main body 1109 rotates downward by using rotation shafts 1113 as fulcrums, the push switch 1116 is pushed by a convex part 1105. Then, the lower surface 1110a of the sensor main body 1109 and the upper surface 1102a of the base 1102 form an acute angle on the front end part side of the sensor main body 1109. If the state is schematically expressed, the state is shown as FIG. 40. In this case, if the sensor main body 1109 is further pushed down to be bent, because the sensor main body 1109 can be displaced by L at the central part, then an angle θ formed by the horizontal line and the upper surface 1011a of the sensor main body 1109 can be expressed by the following formula (3).

$$\theta 2 \cong \sin(\theta) \cong L/(d/2) = 2 \times L/d \quad (3)$$

Consequently, a bent angle φ of the upper surface 1111a of the sensor main body 1109 can be expressed by the following formula (4).

$$\phi = \pi - 2 \times \theta = \pi - 4 \times L/d \quad (4)$$

Consequently, φ2>φ is true, and the sensor main body 1009 of the present embodiment is bent by a degree smaller than that of the comparative example. Consequently, the probability of the damage of the sensor main body 1009 is lower than that of the sensor main body 1109.

Incidentally, the present invention is not limited to the sixth or seventh embodiment, but various changes of the designs of the embodiments are included in the scope of the present invention. In the following, modifications will be cited, but the scope of the present invention is not limited to the following modifications. The following modifications are configured to be similar to the image inputting apparatus 1001 of the sixth or seventh embodiment except for the changed parts. Moreover, the following modifications may be combined with one another within a possible range.

[First Modification]

The position at which the push switch 1016 is provided may be replaced with the position at which the convex part 1005 is provided. If the push switch is provided on the upper surface of the base 1002, then the wiring other than the wired sheet 1015 may be provided on the upper surface of the base 1002, and the wiring may be connected to the push switch. The convex part to push in the push switch may be directly formed on the lower surface 1010a of the chassis 1010, or may be formed on the wired sheet 1015.

[Second Modification]

Moreover, although the convex part 1005 is a projection in the embodiment described above, the convex part 1005 may be a convex or a convex part of another shape.

[Third Modification]

Moreover, a touch switch (a touch sensor to detect a touch) may be provided on the wired sheet 1015 in place of the push switch 1016. In this case, an elastic material (elastic material such as a spring and a rubber) is put between the lower surface of the chassis 1010 and the base 1002, and the touch switch does not touch the convex part 1005 by the elastic material in the natural state thereof (the state in which the sensor main body 1009 is not pushed). On the other hand, when the sensor main body 1009 is pushed down, the elastic material is compressed, and the touch switch touches the convex part 1005. Then, when the depressing of the sensor main body 1009 is released, the elastic material is restored, and the touch switch is separated from the convex part 1005. When the touch switch touches the convex part 1005 here, the touch switch is turned on. When the touch switch is separated from the convex part 1005, the touch switch is turned off. The relationship between the turning-on and the turning-off of the touch switch and the touching and untouching of the touch switch may be contrary. Incidentally, the push switch 1016 may not be a touching type switch such as the touch switch, but may be noncontact type switch.

[Fourth Modification]

Moreover, although the sensor chip 1011 is mounted on the chassis 1010 in the embodiment described above, the sensor chip 1011 may not be mounted on the chassis 1010, but rotation shafts may be formed on the right and left side surfaces of the sensor chip 1011 to be each coupled with the supporting sections 3 and 4. The sensor chip 1011 may be thus adapted to be able to rotate in vertical direction.

[Fifth Modification]

If the image inputting apparatus 1001 described above is mounted on electronic equipment or the like, the base 1002 may be the one common to the housing, the chassis, and the other members of the equipment.

Figure 41:
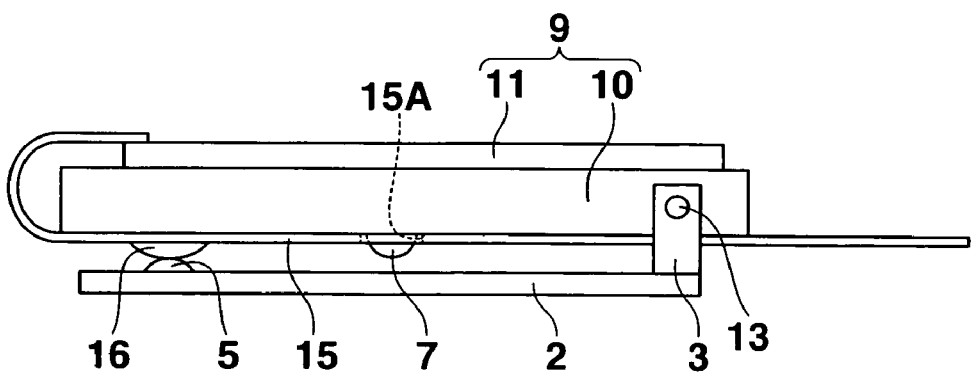
FIG. 41 is a right side view showing an image inputting apparatus of the present invention.
Figure 42:
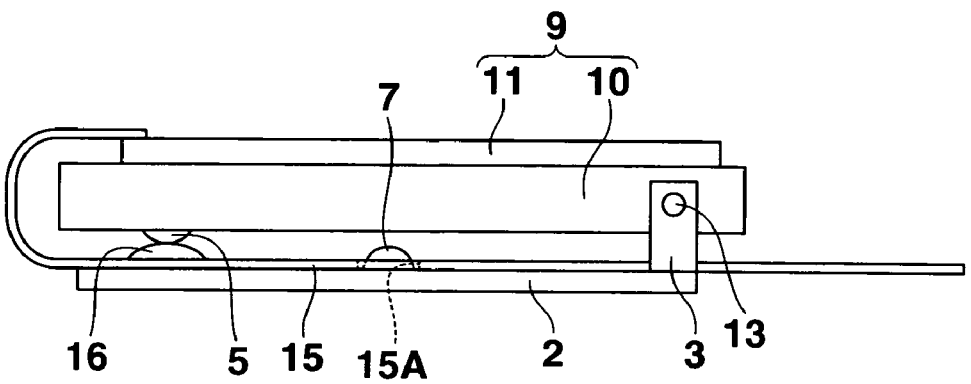
FIG. 42 is another right side view showing the image inputting apparatus of the present invention.
Figure 43:
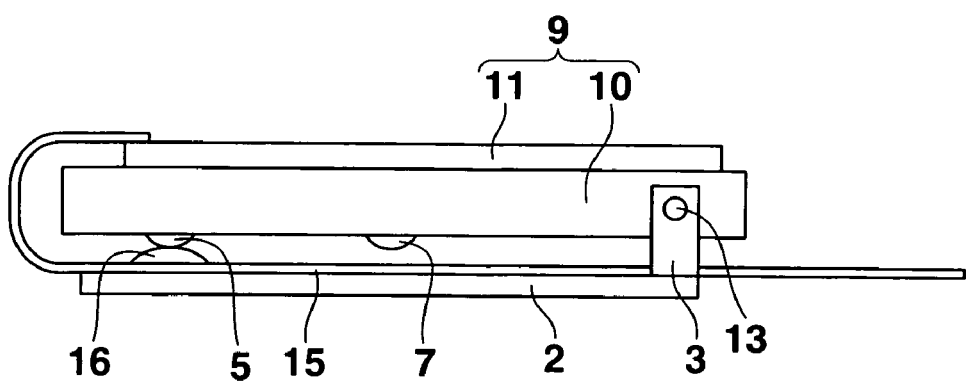
FIG. 43 is a further right side view showing the image inputting apparatus of the present invention.

Incidentally, although a convex part and a sensor receiving section is provided on the base and a switch is provided in the sensor main body in each of the embodiments described above, the configuration of the present invention is not limited to this one. For example, as shown in FIG. 41, the sensor receiving sections 7 and 8 may be provided on the lower surface of the sensor main body 9, and the receiving sections 7 and 8 may be housed in an aperture section 15A formed in the wired sheet 15 disposed on the lower surface of the sensor main body 9 to allow the lower ends of the receiving sections 7 and 8 to project from the lower surface of the wired sheet 15 downward. Moreover, as shown in FIG. 42, the convex part 5 may be provided on the lower surface of the sensor main body 9, and a switch 16 and the wired sheet 15 may be provided on the upper surface of the base 2. Then, the receiving sections 7 and 8 may be housed in the aperture sections 15A formed in the wired sheet 15 disposed on the upper surface of the base 2, and thereby the upper ends of the receiving sections 7 and 8 may project from the upper surface of the wired sheet 15 to the upper side thereof. Moreover, as shown in FIG. 43, the convex part 5 and the receiving sections 7 and 8 may be provided on the lower surface of the sensor main body 9, and the switch 16 and the wired sheet 15 may be provided on the upper surface of the base 2.

All of the disclosures including the patent specification, the claims, the attached drawings and the abstract of Japanese Patent Application No. 2007-118571 filed on Apr. 27, 2007, those of Japanese Patent Application No. 2007-172770 filed on Jun. 29, 2007, those of Japanese Patent Application No. 2007-228917 on Sep. 4, 2007, and those of Japanese Patent Application No. 2007-245027 filed on Sep. 21, 2007 are herein incorporated by reference.

Although various typical embodiments have been shown and described, the present invention is not limited to those embodiments. Consequently, the scope of the present invention can be limited only by the following claims.

What is claimed is:

1. An image inputting apparatus comprising:
a base;
a sensor main body coupled with the base so as to be able to move in a vertical direction on the base;
a switch; and
a convex part;
wherein one of the switch and the convex part is provided on an upper surface side of the base and the other of the switch and the convex part is provided on a lower surface side of the sensor main body; and
wherein the sensor main body starts a sensing operation when the switch is depressed with the convex part.

2. The image inputting apparatus according to claim 1, wherein the base includes a turned-up section having a turned-up part to urge the sensor main body upward in a state of abutting against the lower surface side of the sensor main body.

3. The image inputting apparatus according to claim 1, wherein the base includes a bent section having a bent part to urge the sensor main body upward in a state of abutting against the lower surface side of the sensor main body.

4. The image inputting apparatus according to claim 1, further comprising a wired sheet including patterned wiring connected to the sensor main body, wherein:
an electronic part is mounted on the wired sheet; and
a concave part for housing the electronic part is formed in the sensor main body.

5. The image inputting apparatus according to claim 4, wherein:
the sensor main body includes a back light section to emit a light;
the electronic part includes a light emitting device; and
the concave part for housing the light emitting device is formed in the back light section.

6. The image inputting apparatus according to claim 1, further comprising a wired sheet which is provided on either one of the upper surface side of the base or the lower surface side of the sensor main body, the wired sheet including patterned wiring connected to the sensor main body and the switch.

7. The image inputting apparatus according to claim 1, wherein the convex part is provided at a position corresponding to an outside of a sensing area of the sensor main body, the sensing area capable of performing sensing.

8. An image inputting apparatus comprising:
a base;
a sensor main body coupled with the base so as to be able to move in a vertical direction on the base;
a switch provided on either one of an upper surface side of the base or a lower surface side of the sensor main body;
a rotation shaft to enable the base and the sensor main body to rotate in the vertical direction; and
a receiving section provided on the upper surface side of the base or on the lower surface side of the sensor main body, the receiving section being provided between a rotation shaft center of the sensor main body and a contact surface with which the switch contacts when the sensor main body rotates, or between the rotation shaft center and the switch;
wherein the receiving section supports the sensor main body so as to suppress a deformation of the sensor main body when the sensor main body has been rotated to a base side.

9. The image inputting apparatus according to claim 8, further comprising a supporting section to couple the base with the sensor main body,
wherein the sensor main body can rotate in the vertical direction by using the supporting section as a shaft.

10. The image inputting apparatus according to claim 8, further comprising a convex part formed on the other one of the upper surface side of the base or the lower surface side of the sensor main body at a position corresponding to the switch.

11. The image inputting apparatus according to claim 10, further comprising a wired sheet including patterned wiring connected to a sensor,
wherein the wired sheet is provided on either one of the upper surface side of the base or the lower surface side of the sensor main body, and the convex part is provided at a position to overlap with a part of the wired sheet where the wiring is not formed.

12. The image inputting apparatus according to claim 8, further comprising a wired sheet including patterned wiring connected to a sensor,
wherein the wired sheet is provided on either one of the upper surface side of the base or the lower surface side of the sensor main body, and the receiving section is provided at a position to overlap with a part of the wired sheet where the wiring is not formed.

13. The image inputting apparatus according to claim 8, further comprising a supporting section to couple the base with the sensor main body, wherein the receiving section is disposed between the supporting section and a convex part.

14. The image inputting apparatus according to claim 8, further comprising:
a plurality of the receiving sections; and
a convex part formed on the other one of the upper surface side of the base or the lower surface side of the sensor main body at a position corresponding to the switch, wherein the convex part is provided between the plurality of receiving sections in a direction of the rotation shaft center.

15. The image inputting apparatus according to claim 10, wherein the convex part is provided at a position corresponding to an outside of a sensing area of the sensor main body where sensing can be performed.

16. The image inputting apparatus according to claim 8, wherein the receiving section is provided at a position corresponding to an outside of a sensing area of the sensor main body where sensing can be performed.

17. An image inputting apparatus comprising:
a base;
a sensor main body including a first end face and a second end face provided to be rotatable on the base in a vertical direction; and
a rotation shaft to enable the base and the sensor main body to rotate in the vertical direction;
wherein:
the rotation shaft is situated nearer to the second end face rather than to the first end face, and
when the sensor main body has been rotated to a base side, a part where a surface direction of a lower surface of the sensor main body and a surface direction of an upper surface of the base intersect with each other is situated nearer to the second end face rather than to the first end face, and
an intersection angle formed by the surface direction of the lower surface of the sensor main body and the surface direction of the upper surface of the base forms an acute angle.

18. An image inputting apparatus comprising:
a base;
a sensor main body provided on the base so as to be able to rotate in a vertical direction; and
a rotation shaft to enable the base and the sensor main body to rotate in the vertical direction;
wherein: (i) an upper surface of the base is inclined to a lower surface of the base so that a thickness of the base in the vertical direction gradually increases toward the rotation shaft, or (ii) a lower surface of the sensor main body is inclined to an upper surface of the sensor main body so that a thickness of the sensor main body in the vertical direction gradually increases toward the rotation shaft.

19. An image inputting apparatus comprising:
a base;
a sensor main body including a first end face and a second end face provided on the base so as to be able to rotate in a vertical direction;
a rotation shaft to enable the base and the sensor main body to rotate in the vertical direction; and
a switch provided on either one of an upper surface of the base or a lower surface of the sensor main body at a position of the sensor main body that is distant from the rotation shaft;
wherein:
the rotation shaft is situated nearer to the second end face rather than to the first end face,
when the sensor main body has been rotated to a base side to perform a switch operation of the switch, a part where a surface direction of the lower surface of the sensor main body and a surface direction of the upper surface of the base intersect with each other is situated nearer to the second end face rather than to the first end face, and
an intersection angle of the surface direction of the lower surface of the sensor main body and the surface direction of the upper surface of the base is formed as an acute angle.

20. The image inputting apparatus according to claim 19, wherein the switch is a push switch having a shape capable of being restored.

21. The image inputting apparatus according to claim 19, further comprising a convex part formed on either one of the upper surface of the base or the lower surface of the sensor main body at a position to face to the switch.

22. The image inputting apparatus according to claim 19, wherein an upper surface of the sensor main body and a lower surface of the base are in parallel to each other in a state in which the switch is restored.

23. The image inputting apparatus according to claim 19, wherein a thickness of the base in the vertical direction gradually increases from the switch to the rotation shaft of the sensor main body.

24. The image inputting apparatus according to claim 19, wherein a thickness of the sensor main body in the vertical direction gradually increases from the switch to the rotation shaft of the sensor main body.

25. The image inputting apparatus according to claim 1, wherein:
the sensor main body includes a sensor section provided with a photoelectric conversion element, and a back light section to emit a light, and
the light emitted from the back light section enters the sensor section from a lower surface thereof.

26. The image inputting apparatus according to claim 8, wherein:
the sensor main body includes a sensor section provided with a photoelectric conversion element, and a back light section to emit a light, and
the light emitted from the back light section enters the sensor section from a lower surface thereof.

27. the image inputting apparatus according to claim 19, wherein:
the sensor main body includes a sensor section provided with a photoelectric conversion element, and a back light section to emit a light, and
the light emitted from the back light section enters the sensor section from a lower surface thereof.

\* \* \* \* \*